United States Patent
Nishigaki et al.

(10) Patent No.: US 7,215,334 B2
(45) Date of Patent: May 8, 2007

(54) METHOD AND SYSTEM FOR SUPPORTING USER IN ANALYZING PERFORMANCE OF OBJECT, USING GENERALIZED AND SPECIALIZED MODELS ON COMPUTER

(75) Inventors: Hidekazu Nishigaki, Aichi-gun (JP); Shinji Nishiwaki, Aichi-gun (JP); Yoshio Kojima, Aichi-gun (JP); Tatsuyuki Amago, Aichi-gun (JP); Yasuaki Tsurumi, Aichi-gun (JP); Noboru Kikuchi, Aichi-gun (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 507 days.

(21) Appl. No.: 09/918,539

(22) Filed: Aug. 1, 2001

(65) Prior Publication Data

US 2002/0016697 A1 Feb. 7, 2002

(30) Foreign Application Priority Data

Aug. 3, 2000 (JP) .......... 2000-235233
Jul. 23, 2001 (JP) .......... 2001-222346

(51) Int. Cl.
*G06T 17/00* (2006.01)

(52) U.S. Cl. .......... 345/418; 345/420
(58) Field of Classification Search .......... 345/418, 345/419, 420, 423, 424, 426, 427
See application file for complete search history.

(56) References Cited

U.S. PATENT DOCUMENTS

| | | | | |
|---|---|---|---|---|
| 4,858,146 A | | 8/1989 | Shebini .......... | 364/512 |
| 5,677,857 A | | 10/1997 | Hayashi et al. .......... | 364/578 |
| 6,264,182 B1 | | 7/2001 | Nishiwaki et al. .......... | 267/141 |
| 6,437,779 B1 | * | 8/2002 | Saito et al. .......... | 345/420 |
| 6,545,678 B1 | * | 4/2003 | Ohazama .......... | 345/427 |
| 6,580,426 B1 | * | 6/2003 | Small et al. .......... | 345/421 |

FOREIGN PATENT DOCUMENTS

| | | |
|---|---|---|
| JP | 7-333076 | 12/1995 |
| JP | 8-297684 | 11/1996 |
| JP | 11-272735 | 10/1999 |

OTHER PUBLICATIONS

P. Kagna, et al., Computer–Aided Design 32, pp. 539–552, "Integrated mechanically based CAE system using B–spline finite elements", Copyright 2000, Elsevier Science Ltd.

Mainstream CAE Tools: Technical Considerations and Informative Comparisons, Revised Mar. 1999.

C. Heisig, et al., Society of Automotive Engineers, Inc., pp. 1–11, "Integration of CAD and FEA for Design of Fabricatred Structures", Copyright 1987.

(Continued)

*Primary Examiner*—Phu K. Nguyen
(74) *Attorney, Agent, or Firm*—Oblon, Spivak, McClelland, Maier & Neustadt, P.C.

(57) ABSTRACT

A method of supporting a user in mechanically analyzing a performance of an object, including the steps of: graphically displaying a generalized model which is constructed as a numerical analysis model for the object such that the generalized model has been generalized with respect to at least configuration of the object, and has been specialized with respect to a function of the object; displaying an item for letting the user enter data in order to define a specialized model which is constructed as a numerical analysis model for the object by specializing the displayed generalized model with respect to the at least configuration thereof; and mechanically analyzing the performance of the object, on the basis of the specialized model defined, a numerical analysis approach predetermined in correspondence with the function of the object, and a numerical analysis condition.

24 Claims, 38 Drawing Sheets

OTHER PUBLICATIONS

U. Roy, et al., Concurrent Enginneering:Research and Applications, pp. 1–15, "Unification of CAD and FEM using knowledge Engineering", Copyright 1994.

S. Abrabshahi, et al. Engineering with Computers, pp. 17–26, "Steps Towards CAD–FEA Integration", Copyright 1993, Springer–Verlage London Limited.

* cited by examiner

POINT-DATA INPUT SHEET

| POINT | X | Y | Z |
|---|---|---|---|
| 1 | 123 | 12 | 321 |
| 2 | 456 | 34 | 654 |
| 3 | 789 | 56 | 987 |
| 4 | 101112 | 78 | 121110 |
| 5 | 131415 | 910 | 151413 |
| 6 | 123 | 12 | 321 |
| 7 | 456 | 34 | 654 |
| 8 | 789 | 56 | 987 |
| 9 | 101112 | 78 | 121110 |
| 10 | 131415 | 910 | 151413 |

| POINT | X | Y | Z |
|---|---|---|---|
| 11 | 123 | 12 | 321 |
| 12 | 456 | 34 | 654 |
| 13 | 789 | 56 | 987 |
| 14 | 101112 | 78 | 121110 |
| 15 | 131415 | 910 | 151413 |
| 16 | 123 | 12 | 321 |
| 17 | 456 | 34 | 654 |
| 18 | 789 | 56 | 987 |
| 19 | 101112 | 78 | 121110 |
| 20 | 131415 | 910 | 151413 |

FIG.10

| | A | B | C | D | E | F | G | H | I | J | K | L | M | N |
|---|---|---|---|---|---|---|---|---|---|---|---|---|---|---|
| 1 | | | | | | | | | | | | | | |
| 2 | | ANALYSIS RESULTS SHEET | | | | | | | | | | | | |
| 3 | | | | | | | | | | | | | | |
| 4 | | POINT | X | Y | Z | | | POINT | X | Y | Z | | | |
| 5 | | 1 | 123 | 12 | 321 | | | 11 | 123 | 12 | 321 | | | |
| 6 | | 2 | 456 | 34 | 654 | | | 12 | 456 | 34 | 654 | | | |
| 7 | | 3 | 789 | 56 | 987 | | | 13 | 789 | 56 | 987 | | | |
| 8 | | 4 | 101112 | 78 | 121110 | | | 14 | 101112 | 78 | 121110 | | | |
| 9 | | 5 | 131415 | 910 | 151413 | | | 15 | 131415 | 910 | 151413 | | | |
| 10 | | | | | | | | | | | | | | |
| 11 | | 6 | 123 | 12 | 321 | | | 16 | 123 | 12 | 321 | | | |
| 12 | | 7 | 456 | 34 | 654 | | | 17 | 456 | 34 | 654 | | | |
| 13 | | 8 | 789 | 56 | 987 | | | 18 | 789 | 56 | 987 | | | |
| 14 | | 9 | 101112 | 78 | 121110 | | | 19 | 101112 | 78 | 121110 | | | |
| 15 | | 10 | 131415 | 910 | 151413 | | | 20 | 131415 | 910 | 151413 | | | |

| NUMBER OF NODES | NUMBER OF ELEMENTS |
|---|---|
| 8 | 10 |

LOADING:
CONSTRAINT:
BY-BUSHING CONSTRAINT: B SPRING CONSTANT (E.G.:B10)

L LOAD VALUE (E.G.; L10)
IF CONSTRAINED (=1)

| NODE NUMBER | X-COORDINATE [mm] | Y-COORDINATE [mm] | Z-COORDINATE [mm] | X-DIRECTION | Y-DIRECTION | Z-DIRECTION | ABOUT X-AXIS | ABOUT Y-AXIS | ABOUT Z-AXIS |
|---|---|---|---|---|---|---|---|---|---|
| 1 | 0 | 0 | 0 | 1 | 1 | 1 | 1 | 1 | 1 |
| 2 | 1000 | 0 | 0 | | | | | | |
| 3 | 3000 | 0 | 0 | | | | | | |
| 4 | 4000 | 0 | 0 | | | L-10000 | | | |
| 5 | 0 | 0 | 1000 | 1 | 1 | 1 | 1 | 1 | 1 |

| ELEMENT NUMBER | NODE1 | NODE2 | E[N/mm2] | $\nu$ | $\rho$ [kg/mm3] | Bush side | ktx | kty | ktz |
|---|---|---|---|---|---|---|---|---|---|
| 1 | 1 | 2 | 206000 | 0.3 | 7.85E-06 | | | | |
| 2 | 2 | 3 | 206000 | 0.3 | 7.85E-06 | | | | |
| 3 | 3 | 4 | 206000 | 0.3 | 7.85E-06 | | | | |
| 4 | 5 | 6 | 206000 | 0.3 | 7.85E-06 | | | | |
| 5 | 6 | 7 | 206000 | 0.3 | 7.85E-06 | | | | |

FIG.28

| ELEMENT NUMBER | NODE 1 | NODE 2 | NODE 3 | NODE 4 | E[N/mm2] | ν | Thickness |
|---|---|---|---|---|---|---|---|
| 1 | 2 | 3 | 7 | 6 | 206000 | 0.3 | 0.8 |
| 2 | 3 | 4 | 8 | 7 | 206000 | 0.3 | 0.8 |

FIG.32

METHOD AND SYSTEM FOR SUPPORTING USER IN ANALYZING PERFORMANCE OF OBJECT, USING GENERALIZED AND SPECIALIZED MODELS ON COMPUTER

This application is based on Japanese Patent Applications No. 2000-235233 filed Aug. 3, 2000, and No. 2001-222346 filed Jul. 23, 2001, the contents of which are incorporated hereinto by reference.

CROSS-REFERENCE TO RELATED APPLICATIONS

Not Applicable.

BACKGROUND OF THE INVENTION

1. Field of the Invention

The present invention relates to a technology of supporting a user in mechanically analyzing the performance of an object, using an input device, a display device having a screen for display, and a computer connected to the input device and the display device.

2. Discussion of the Related Art

There have existed some practical technologies of supporting a user in mechanically analyzing the performance of an object, using a computer. In a process of developing an automobile as one example of the object, the practical technologies have been employed to support in designing the automobile, for example.

It has been general that two divisions are mainly involved in automotive development. One is a design division where design of an automobile is performed, the other is an evaluation division where evaluation of the performance of the designed automobile is performed.

As shown in FIG. 38, the process of developing an automobile is initiated with a concept designing and a detailed designing of parts or components of the automobile in the aforementioned design division, wherein the detailed designing follows the concept designing. Then, the performance of the automobile to be manufactured according to a design draft made in the aforementioned developing process is evaluated by using a prototype made according to the design draft, or by executing analysis according to a numerical approach such as Finite Element Method, FEM, wherein the analysis may be categorized into Computer Aided Engineering, CAE, for example.

The evaluation results obtained in the above-mentioned evaluation division are informed to the above-mentioned design division. When the evaluation results demonstrate that the present design draft would lead to unsatisfactory performance of the automobile, design change for the automobile is performed in the design division on the basis of the evaluation results. After this design change, the performance of the automobile is again evaluated in the evaluation division with respect to a new design draft of the automobile made in the design division.

Where the new evaluation results demonstrate again that the present design draft would lead to unsatisfactory performance of the automobile, another design change is made in the design division. Instead, where the new evaluation results demonstrate that the present design draft would lead to satisfactory performance of the automobile, the designing and evaluating process for the automobile is terminated, followed by construction of the automobile.

Conventionally, development of analyzing technologies has been oriented to improvement in analyzing accuracy, improvement in availability to kinds of objects to be analyzed, and so on. Consequently, in the process of developing an automobile, for example, it has become capable of quantitatively estimating the performance of a whole automobile realizing a design draft to some extent, without using a prototype realizing the design draft.

However, on the other hand, the conventional analyzing technologies have been greatly advanced in terms of their sophistication and diversity of function, so as to require high-level expertise for utilizing those technologies. It follows that those technologies are available only to professional analyzers. For this reason, in a conventional automobile development process, for example, professional analyzers perform analysis of the performance of an automobile after the completion of the above-mentioned detailed designing, such that the analysis serves as an alternative of experimental evaluation mainly using a prototype of the automobile to be evaluated.

Thus, the analysis is performed after the completion of the detailed designing. However, at the time of the completion of the detailed designing, a fundamental policy, namely, a framework of a design of an automobile has been almost fixed. Therefore, it is difficult to make an innovative design change in the light of the results from the analysis, due to the limitation on a man-hour which is for planned for designing. That is, it is a fact that, in the conventional automobile development process, an analysis which is originally intended to support in designing, although it can support in performing experimental evaluation, fails to directly support in designing.

In other words, the conventional analyzing technologies have placed stress on analyzing accuracy and versatility, not on easiness to use those technologies.

BRIEF SUMMARY OF THE INVENTION

It is therefore an object of the present invention to provide a technology of supporting a user in mechanically analyzing the performance of an object, using a computer, so as to improve easiness to use this technology.

The object may be achieved according to any one of the following modes of this invention. Each of these modes of the invention is numbered, and depends from the other mode or modes, where appropriate. This type of explanation about the present invention is for better understanding of some instances of a plurality of technological features and a plurality of combinations thereof disclosed in this specification, and does not mean that the plurality of technological features and the plurality of combinations in this specification are interpreted to encompass only the following modes of this invention:

(1) A method of supporting a user in mechanically analyzing a performance of an object, using an input device, a display device having a screen for display, and a computer connected to the input device and the display device, comprising:

a first step of graphically displaying on the screen a generalized model which is constructed as a numerical analysis model for the object such that the generalized model has been generalized with respect to at least configuration of a configuration, a structure, and a mechanism, of the object, and has been specialized with respect to a function of the object;

a second step of displaying on the screen an item for letting the user enter data using the input device in order to define a specialized model which is constructed as a numerical analysis model for the object by specializing the displayed generalized model with respect to the at least configuration thereof, and a third step of mechanically analyzing the performance of the object, on the basis of the specialized model defined by the data entered by the user in association with the displayed item, a numerical analysis approach predetermined in correspondence with the function of the object, and a numerical analysis condition determined by the user or predetermined as a standard condition.

In this method according to the above mode (1), a numerical analysis model used to analyze a performance of an object has been specialized with respect to a function of the object, and a numerical analysis approach used to analyze the performance of the object in cooperation with the numerical analysis model is predetermined in correspondence with the function of the object. Thus, in this method, both of the numerical analysis model and the numerical analysis approach have been specialized with respect to the function of the object.

Therefore, this method would facilitate reduction in an amount of data which the user is required to enter into the computer for defining the numerical analysis model, and would permit the numerical analysis approach to be selected so as to analyze the performance of the object without wasting time and labor.

As a result, this method would make it easier to save computation time during which the computer is necessarily caused to execute a program for implementing the numerical analysis approach.

Further, this method would permit an easy-to-use analyzing technology to be provided without placing a high-speed and large-capacity computer as an essential.

Furthermore, in this method, a basis used to define the specialized model which serves as a numerical analysis model, which basis means the generalized model which has been generalized with respect to at least configuration of a configuration, a structure, and a mechanism, of the object, and which has been specialized with respect to the function of the object, is graphically displayed on the screen.

Therefore, this method would permit the user to easily define the specialized model on the basis of the generalized model.

In addition, where this method is practiced in a form where the numerical analysis condition is predetermined as a standard condition, it would permit the user to leave out a defining process for the numerical analysis condition.

Consequently, this would also result in an improved easiness-to-use for the user.

The term "performance" in the above mode and other modes may be interpreted to include at least one of static or dynamic mechanical properties, mechanistic properties, vibration properties, motion properties, etc., of the object. More specifically, the term "performance" may be interpreted to include at least one of motion of the object (e.g., motion of the object itself, or motion between a plurality of components of the object), and sensitivity properties of the object, such as elastic deformation, plastic deformation, fracture properties, impact absorption properties, etc., of the object.

The term "object" in the above mode and other modes may be interpreted to mean a whole object which is constructed by a plurality of partial objects, or to mean that the object is constructed by a plurality of components. Here, the term "components" may be replaced by the term "constituents", or may be interpreted to mean that those components are affiliated with these constituents such that those components serve as parents, while these constituents serve as their children, and vice versa.

The term "function" in the above mode and other modes may be interpreted to mean operation, action, role, application, etc. In addition, the term "function" may be defined to mean properties which is required to be considered for the object in designing a configuration, a structure, and a mechanism, of the object, such that the object eventually exhibits the properties.

There will be described the relationship between the terms "configuration," "structure," and "mechanism" in the above mode and other modes, by way of examples.

Where the object is constructed by a single member, the object can be defined by its configuration (this may be used to include a size of the object, for example). Where the object is constructed by a plurality of members, provided that these members are joined together so as not to permit relative movement therebetween, the object can be defined by a whole configuration of the object (this may mean a configuration of a surface of the object, e.g.), and a structure defining arrangement between the plurality of members, for example. On the other hand, where the plurality of members are joined together so as to permit relative movement therebetween, the object can be defined by a whole configuration and structure of the object, and a mechanism meaning a scheme and a condition for permitting the relative movement between those members.

The phrase "a generalized model which is constructed such that the generalized model has been generalized with respect to at least configuration of the object" in the above mode and other modes means a numerical analysis model which is constructed to be flexible in at least configuration of the object. The phrase "a generalized model which is constructed such that the generalized model has been specialized with respect to a function of the object" means a numerical analysis model which is constructed to be fixed in the function of the object.

The phrase "has been generalized with respect to at least configuration of a configuration, a structure, and a mechanism, of the object" may be interpreted to optionally include a first meaning in which the generalized model has been generalized with respect to the configuration, the structure, and the mechanism, a second meaning in which the generalized model has been generalized with respect to the configuration, and has been specialized with respect to the structure and the mechanism, and a third meaning in which the generalized model has been generalized with respect to the configuration, and one of the structure and the mechanism, and has been specialized with respect to the other of the structure and the mechanism.

Converting the generalized model into the specialized model requires, in the case of the above first meaning, specializing the generalized model with respect to its configuration, structure, and mechanism; in the case of the above second meaning, specializing the generalized model with respect to its configuration; and in the case of the third meaning, specializing the generalized model with respect to its configuration, and one of its structure and mechanism.

(2) The method according to the above mode (1), wherein the numerical analysis model has a plurality of features representing geometrical properties of the object in the form of a node having an attribute thereof and a discrete element having an attribute thereof.

In this method according to the above mode (2), conceptually, a numerical analysis model of the object is constructed by a sole discrete element or a combination of a plurality of discrete elements. That is, the object is approximated by at least one discrete element each having a configuration simpler than that of the object, whereby the numerical analysis model is constructed by the at least one discrete element.

Consequently, this method would facilitate representation of the object by the numerical analysis model in order to design the object, by the user's simplified operation for a reduced time.

The term "discrete element" may be defined to mean an element which extends a given direction in a one-, two-, or three-dimensional domain, and which exhibits its geometrical property uniformly along the given direction.

(3) The method according to the above mode (2), wherein the discrete element comprises at least one of:

a beam element having an attribute thereof, a panel element having an attribute thereof, and a design domain, a structure of which is intended to be designed by a topology optimization for achieving a required function, the design domain has an attribute thereof.

(4) The method according to any one of the above modes (1) to (3), wherein the third step is for mechanically analyzing the performance of the object by directly using the specialized model defined in the second step.

In a conventional numerical analysis, after completion of designing an object, a design model representative of the designed object is partitioned into a plurality of elements. That is, a so-called "meshing operation" is performed. Then, a numerical analysis is conducted using the plurality of elements.

For this reason, the conventional numerical analysis has tended to be time-consuming for preparation of the analysis, and additionally for operation of the analysis itself.

On the other hand, in the method according to the above mode (4), as described above, a numerical analysis model which is constructed by approximating the object by the above discrete elements, is used for the object from the beginning. That is, the same model may be used through both of a designing stage of the object, in which stage the numerical analysis model is constructed, and an analyzing stage of the object, in which stage the object is analyzed using the constructed numerical analysis model.

Therefore, when practicing the method according to the above mode (4), once the object has been designed by the user's defining a numerical analysis model for the object, the user may not need to construct another model for analyzing the designed object. Thus, a model required to be constructed by the user is unitary through the designing and the analyzing stage.

Consequently, this method would let the designing and analysis of the designed object be completed in a reduced time.

In addition, in this method, a numerical analysis is performed by directly using a numerical analysis model which is constructed by approximating the object by at least one discrete element. In other words, the numerical analysis is conducted by individually treating the at least one discrete element as the unit of execution during the analysis.

For this reason, this method would make the above-mentioned meshing operation to be unessential.

As a result, this method would facilitate reduction in the time required to prepare the numerical analysis and in the time required to conduct the numerical analysis itself, leading to the fact that a series of operations for the numerical analysis would be completed by the user's simple operation for a reduced time.

(5) The method according to any one of the above modes (1) to (3), wherein the third step is for partitioning the discrete element in the specialized model defined in the second step, into a plurality of elements, in order to construct a mesh model, and for mechanically analyzing the performance of the object using the constructed mesh model.

(6) The method according to any one of the above modes (1) to (5), wherein the numerical analysis model is used for provisionally designing the object, and for qualitatively analyzing the performance of the provisionally designed object in order to simply evaluating the provisionally designed object.

This method would let the user design the object and to qualitatively analyze the designed object in a simple manner, not at the above-mentioned detailed designing stage but at the above-mentioned concept designing stage, namely, a provisionally designing stage of the object.

(7) The method according to any one of the above modes (1) to (6), wherein the item is for letting the user enter using the input device, data for specializing the generalized model with respect to at least configuration of a configuration, a structure, and a mechanism, of the generalized model.

(8) The method according to any one of the above modes (1) to (7), wherein the second step comprises a fourth step of displaying on the screen in association with the displayed generalized model, a figure for supporting the user in graphically entering data for the item.

This method would permit the user to graphically enter data for defining a numerical analysis model by specializing the generalized model, leading to an improved easiness to use for the user.

(9) The method according to the above mode (8), wherein the item is used for letting the user enter numerical data, and the fourth step comprises a displaying step of displaying on the screen a figure for supporting the user in graphically entering the numerical data in association with the item.

This method would permit the user to graphically enter numerical data for defining a numerical analysis model by specializing the generalized model. Therefore, the user becomes capable of defining the numerical analysis model more simply than when the user directly enters numerical data for defining the numerical analysis model using a keyboard, that is, when the data entry is conducted without such a graphical support of the computer.

As a result, when the user attempts to roughly asses the performance of the object, this method would not require the data entry to have an accuracy exceeding that required for the attempted assessment.

(10) The method according to the above mode (9), wherein the input device comprises a pointing device thereof, the displaying step comprises an input support step of displaying a bar, a pointer, or a cursor which is moved on the screen depending on an amount by which the user operates the pointing device of the input device, and which permits numerical data to enter into the computer depending on an amount by which the bar, the pointer, or the cursor has been moved, with respect to the item, to thereby support the user in entering the numerical data into the computer.

This method would permit the user to define the numerical analysis model by operating the pointing device while seeing the bar, the pointer, or the cursor on the screen, resulting in an improved easiness to use for the user.

(11) The method according to the above mode (9) or (10), wherein the input device comprises a keyboard thereof, the second step further comprises:

a fifth step of displaying on the screen an indication permitting the user to directly enter the numerical data by operating the keyboard of the input device; and a sixth step of selectively effecting the fourth step and the fifth step.

In defining a numerical analysis model by specializing the generalized model, graphical data-entry tends to sacrifice precision of the data entry, in compensation for improvement in easiness to use for the user, and eventually sacrifice analyzing accuracy, as opposed to the case where the data-entry is directly conducted using a keyboard.

In contrast, in this method according to the above mode (11), the user can select as a manner of the data-entry, one of the graphical data-entry and the direct data-entry, namely, a numerical data-entry. Therefore, this method would permit a manner of the data-entry to be easily adapted to the user's desire with respect to the analyzing accuracy.

(12) The method according to any one of the above modes (1) to (11), wherein the third step comprises a seventh step of graphically displaying on the screen in association with the object, analysis results obtained from the numerical analysis model.

This method would permit the analysis results to be graphically displayed on the screen, leading to the capability of the user to sensuously understand the analysis results, whereby evaluation of the analysis results becomes easy to be conducted.

In addition, where this method is practiced in a form in which the analysis results are graphically displayed on the screen collectively for a plurality of segments of the same object, the user would be capable of readily comparing those segments with each other from the perspective of the analysis results.

(13) The method according to the above mode (12), wherein the analysis results comprise mechanical characteristic values for a segment of the object, and the seventh step comprises a displaying step of graphically displaying on the screen each one of the mechanical characteristic values, in the form of a figure which is changed in at least one of a size, a configuration, a pattern, and a color, of the figure, depending on a magnitude of the each one of the mechanical characteristic values.

This method would permit the mechanical characteristic values which serve as the analysis results, to be graphically displayed on the screen, such that each one of the mechanical characteristic values is indicated by a figure which is changed in at least one of a size, a configuration, a pattern, and a color, of the figure, depending on a magnitude of the each one of the mechanical characteristic values. Therefore, the user would be capable of easily sensuously understand the analysis results.

The term "mechanical characteristic values" optionally include a location, a velocity, or an acceleration in motion of the object itself or in motion between a plurality of segments of the object; an amount of strain energy of the object; an amount or its changing rate, of elastic or plastic deformation of the object; an acceleration or an amount of energy representative of fracture characteristics, impact absorption characteristics, sensitivity characteristics, etc., of the object.

(14) The method according to the above mode (12) or (13), wherein the third step further comprises:
- a eighth step of numerically displaying the analysis results on the screen; and
- a ninth step of selectively effecting the seventh step and the eighth step.

In displaying the analysis results, a manner of graphically displaying the analysis results would tend to sacrifice precision in conveying the analysis results to the user, in compensation for improvement in easiness for the user to evaluate the analysis results, as opposed to the case where the analysis results are numerically displayed. Wherein, the above precision in conveying means a displaying accuracy of the analysis results.

In contrast, in the method according to the above mode (14), the user can select as a manner of displaying the analysis results, one of the graphical displaying, and a direct displaying by numeral, namely, a numerical displaying. Therefore, this method would permit the user to easily adapt a manner of displaying the analysis results to the user's desire with respect to the displaying accuracy.

(15) The method according to any one of the above modes (1) to (14), wherein the object is a subject one of a plurality of components of a single product, which subject component has been selected by the user, the generalized model is a subject generalized-model corresponding to the subject component, the subject generalized-model is one of a plurality of numerical analysis models respectively for the plurality of components, each of which has been generalized with respect to at least configuration of a configuration, a structure, and a mechanism, of each one of the plurality of components, and has been specialized with respect to a function of the each component, the first step comprises a displaying step of displaying the plurality of components distinguishably from each other on the screen, of displaying an indication on the screen for permitting the user to select as the subject component one of the plurality of components, and of graphically displaying on the screen one of the plurality of generalized models which corresponds to the subject component which has been selected by the user in response to the indication, the third step comprises an analyzing step of mechanically analyzing a performance of the subject component, on the basis of the specialized model defined by data which has been entered by the user in association with the displayed item on the screen, the numerical analysis approach predetermined in correspondence with the function of the subject component, and the numerical analysis condition.

In this method according to the above mode (15), the object is one of a plurality of components of a sole product, which has been selected by the user at will. In addition, a numerical analysis model is utilized for each component of the product, and a numerical analysis approach has been selected for each numerical analysis model, in correspondence with the function of the subject component corresponding to the each numerical analysis model. Furthermore, those numerical analysis model and numerical analysis approach have been specialized with respect to the function of the each component.

Consequently, in this method, after the user has selected at will one of the plurality of components of the sole product as the subject component, the analysis for the subject component will be conducted using the numerical analysis model and numerical analysis approach both of which have been specialized with respect to the function of the subject component.

Therefore, this method would permit the analysis for individual component to be effected relatively expeditiously by the user's relatively simple operations, compared with the case where both of the numerical analysis model and numerical analysis approach have been improved in general-purpose properties thereof for all the components.

In addition, this method would permit the generalized model for the subject component to be graphically displayed on the screen, before the user has defined the numerical analysis model, namely, the specialized model for the subject component.

The "plurality of components" in the above mode and other modes may be constructed in the form of a plurality of parts which can exist physically apart from each other, or in the form of a plurality of segments constructing a sole product, which segments have been integrally formed.

(16) A method of supporting a user with a computer, in mechanically analyzing a performance of one of a plurality of components of a single product, which one component has been selected by the user, comprising the steps of:

mechanically analyzing the performance of a subject component which is one of the plurality of components which has been selected by the user, on the basis of (a) a subject numerical analysis model which has been selected by the user as one of a plurality of numerical analysis models respectively for the plurality of components, each of which models has been generalized with respect to at least configuration of a configuration, a structure, and a mechanism, of each one of the plurality of components, and has been specialized with respect to a function of the each component, and each of which models has been defined by data entered into the computer by the user, (b) a numerical analysis approach which is predetermined in correspondence with the function of the subject component, and (c) a numerical analysis condition which is determined by the user or predetermined as a standard condition; and displaying analysis results obtained in the analyzing step, on a screen of the computer.

In this method according to the above mode (16), like in the method according to the mode (15), a numerical analysis model is utilized for each component of a sole product, and a numerical analysis approach has been selected for each numerical analysis model, in correspondence with the function of the component corresponding to the each numerical analysis model. Furthermore, those numerical analysis model and numerical analysis approach have been specialized with respect to the function of the each component.

Consequently, in this method, like in the method according to the mode (15), after the user has selected at will one of the plurality of components of the sole product as a subject component, the analysis for the subject component will be conducted using the numerical analysis model and numerical analysis approach both of which have been specialized with respect to the function of the subject component.

Therefore, this method would, like the method according to the mode (15), permit the analysis for individual component to be effected relatively expeditiously by the user's relatively simple operations, compared with the case where both of the numerical analysis model and numerical analysis approach have been improved in general—purpose properties thereof for all the components.

(17) A method of supporting a user in mechanically analyzing a performance of an object, using an input device, a display device having a screen for display, and a computer connected to the input and the display device, the improvement of the method comprising a construction support step usable before a specialized model has been defined by the user's converting a generalized model into the specialized model, the generalized model serves as a numerical analysis model for the object, has been generalized with respect to at least configuration of a configuration, a structure, and a mechanism, of the object, has been specialized with respect to a function of the object, and has a plurality of features representing geometrical properties of the object in the form of a node having an attribute thereof and a discrete element having an attribute thereof, the specialized model is obtained by specializing the generalized model with respect to the at least configuration, the construction support step is used to display on the screen an indication for supporting the user in producing the generalized model by the user's defining the node and the discrete element using the input device.

This method according to the above mode (17), would permit the user to construct the generalized model for the use of the method according to the above mode (1), depending on the user's need, and would permit the user to easily construct the generalized model with the support of the computer.

This method according to the above mode (17) may be practiced together with any one of the above modes (1) to (16).

(18) The method according to the above mode (17), wherein the construction support step comprises:

a node definition support step of, in response to an action that the user identifies, for defining the node, a location at which the node is to be established, on the screen using the input device, displaying a node figure representative of being the node, at the identified location, and, in response to an action that the user indicates the displayed node figure, displaying a first support indication for supporting the user in setting the attribute of the node which has been represented by the displayed node figure; and a discrete element definition support step of, in response to an action that the user identifies, for defining the discrete element, a location at which the discrete element is to be established, on the screen using the input device, displaying a discrete element figure representative of being the discrete element, at the identified location, and, in response to an action that the user indicates the displayed discrete element figure, displaying a second support indication for supporting the user in setting the attribute of the discrete element which has been represented by the displayed discrete element figure.

This method would permit the user to set the attribute of the node and the discrete element with the support of the computer, resulting in a simplified operation of the user for setting those attributes.

In addition, where this method is practiced in a form in which contents of the attribute to be required for the user to enter into the computer, is presented to the user in advance, the user can set the attribute without any missing items thereof, not relying on a special training received in advance.

The term "attribute of the node" may be defined to include at least one of a condition on motion, on displacement, on stiffness, on force, with respect to the node.

Here, one example of the "condition on motion" is a degree of freedom at the node, of motion of an element to which the node belongs, one example of the "condition on displacement" is an amount of displacement which is set to the node, one example of the "condition on force" is a stress externally applied to the node, one example of the "condition on stiffness" is a stiffness of the node against its nodal force.

(19) The method according to the above mode (18), wherein the discrete element comprises a beam element having an attribute thereof, the attribute of the beam element comprises at least one of a cross-section shape of a real member represented by the beam element, a thickness of the real member, and a material property of the real member, the discrete element definition support step comprises a beam-element definition support step of, in response to an action that the user identifies, for defining the beam element, a location at which the beam element is to be established, on the screen using the input device, displaying a beam-element figure representative of being the beam element, at the identified location, and, in response to an action that the user indicates the displayed beam-element figure, displaying as the second support indication, an indication for supporting the user in setting the attribute of the beam element which has been represented by the displayed beam element figure.

This method according to the above mode (19) would permit the user to set the attribute of the beam element with the support of the computer.

One example of the term "beam element" in the above mode and other modes is an element extending with a solid cross-section thereof, and another example is an element extending with a hollow cross-section thereof.

(20) The method according to the above mode (19), wherein the attribute of the beam element comprises a cross-section shape of the real member represented by the beam element, the method further comprises a cross-section shape displaying step of, once the user sets the cross-section shape depending on the second support indication, graphically displaying the set cross-section shape on the screen.

This method according to the above mode (20) would permit the user, after setting a cross-section shape of a real member represented by the beam element, to graphically confirm the set cross-section shape on the screen.

Consequently, this method would allow the user to easily review whether the set cross-section shape is appropriate or not.

(21) The method according to any one of the above modes (18) to (20), wherein the discrete element comprises a panel element having an attribute thereof, the attribute of the panel element comprises at least one of a thickness of a real member represented by the panel element, and a material property of the real member, the discrete element definition support step comprises a panel-element definition support step of, in response to an action that the user identifies, for defining the panel element, a location at which the panel element is to be established, on the screen using the input device, displaying a panel-element figure representative of being the panel element, at the identified location, and, in response to an action that the user indicates the displayed panel-element figure, displaying as the second support indication, an indication for supporting the user in setting the attribute of the panel element which has been represented by the displayed panel-element figure.

This method according to the above mode (21) would permit the user to set the attribute of the panel element with the support of the computer.

(22) The method according to any one of the above modes (18) to (21), wherein the discrete element comprises a design domain, a structure of which is intended to be designed by a topology optimization for achieving a required function, the design domain has an attribute thereof, the attribute of the design domain comprises a condition on the structure to be adapted to the design domain, the discrete element definition support step comprises a design-domain definition support step of, in response to an action that the user identifies, for defining the design domain, a location at which the design domain is to be established, on the screen using the input device, displaying a design-domain figure representative of being the design domain, at the identified location, and, in response to an action that the user indicates the displayed design-domain figure, displaying as the second support indication, an indication for supporting the user in setting the attribute of the design domain which has been represented by the displayed design-domain figure.

This method according to the above mode (22) would permit the user to set the attribute of the design domain with the support of the computer.

The term "structure to be adapted to the design domain" in this mode may be a combination of a plurality of beam elements connected to each other at a plurality of nodes, for example. In this example, the term "condition on the structure" in this mode may be defined to include at least one of the number of the plurality of beam elements, and the number of the plurality of nodes, for example.

(23) The method according to any one of the above modes (17) to (22), further comprising a boundary-condition setting support step of displaying on the screen a third indication for supporting the user in setting using the input device a boundary condition given on a boundary of a domain which has been defined by the generalized model as an area to be analyzed.

This method according to the above mode (23) would permit the user to set the boundary condition for the generalized model with the support of the computer.

The term "boundary condition" in this mode may be defined to include at least one of a condition on motion, on displacement, on stiffness, and force, with respect to the node of the generalized model.

(24) The method according to any one of the above modes (17) to (23), wherein the object is a product constructed by a combination of a plurality of parts, an organizational relationship according to which the plurality of parts are associated with each other is hierarchal, the method further comprises a whole generalized-model construction step of, when the user sets the organizational relationship using the input device, in response to an event that the generalized model has been constructed for each of the plurality of parts as a partial generalized-model, integrating a plurality of partial generalized-model respectively constructed for the plurality of parts, according to the set organizational relationship, to thereby automatically construct a whole generalized-model representative of the whole of the product.

This method according to the above mode (24) would permit the user, where the object is a product constructed by a combination of a plurality of parts, and where an organizational relationship according to which those parts are affiliated with each other is hierarchal, to construct the generalized model individually for each part of the product, not generally for the whole of the product.

Therefore, this method would permit a plurality of users, where a product is constructed by a combination of a plurality of parts, to construct a plurality of the generalized models for the plurality of parts, such that the plurality of parts are assigned to these users respectively, and such that these users construct the plurality of the generalized models in parallel with each other.

Consequently, this method would facilitate improvement in efficiency in producing the generalized models for the whole of a product which is constructed by a combination of a plurality of parts thereof.

(25) The method according to any one of the above modes (17) to (24), further comprising a reproducing step of storing as a template procedures in which the generalized model has been constructed by the user using the input device, into a memory of the computer, and, in response to a specific command from the user, reading out the template from the memory for thereby automatically reproducing the same generalized model.

This method according to the above mode (25) would permit the history of the user's operations for the computer in order to construct a generalized model, to be stored in the computer.

Consequently, this method would make it unnecessary for the user to reiterate the same operations that were performed in the past, in order to construct the same generalized model that was constructed in the past, resulting in the capability of the user to remove a wasteful operation.

(26) The method according to any one of the above modes (1) to (25), wherein each of a plurality of sets of data representative of the generalized model, the specialized model, the numerical analysis approach, and the numerical analysis condition, respectively, has been constructed in an executable format in which the each set of data can be executed by an operating system installed in the computer, without causing the computer to execute a special application program.

This method according to the above mode (26) would permit at least one of construction of a generalized model, conversion of the constructed generalized model into a specialized model, and numerical analysis using the specialized model, to be performed on the computer, without causing the computer to execute a special application program.

(27) A computer program to be executed by a computer to implement the method according to any one of the above modes (1) to (26).

When a computer program according to the above mode (27) is executed by a computer, the same advantageous effects as the method set forth in any one of the above modes (1) to (26) would provide would be provided, according to basically the same principle as one accepted in the method set forth in any one of the above modes (1) to (26).

The term "program" defined in the above mode (27) may be interpreted to include, not only a set of instructions to be executed by a computer so that the program may function, but also any files and data to be processed by the computer according to the set of instructions.

(28) A computer-readable storage medium having stored therein the computer program according to the above mode (27).

When the program having been stored in the computer-readable storage medium according to the above mode (28) is executed by a computer, the same advantageous effects as the method set forth in any one of the above modes (1) to (26) would provides would be provided.

The "storage medium" defined in the above mode (28) may be realized in different types, including a magnetic recording medium such as a floppy-disc, an optical recording medium such as a CD and a CD-ROM, an optical-magnetic recording medium such as an MO, an unremovable storage such as a ROM, for example.

(29) A system including an input device, a display device having a screen for display, and a computer connected to the input device and the display device, thereby supporting a user in mechanically analyzing a performance of an object, comprising:

a first means for graphically displaying on the screen a generalized model which is constructed as a numerical analysis model for the object such that the generalized model has been generalized with respect to at least configuration of a configuration, a structure, and a mechanism, of the object, and has been specialized with respect to a function of the object;

a second means for displaying on the screen an item for permitting the user to enter data using the input device in order to define a specialized model which is constructed as a numerical analysis model for the object by specializing the displayed generalized model with respect to the at least configuration thereof, and a third means for mechanically analyzing the performance of the object, on the basis of the specialized model defined by the data entered by the user in association with the displayed item, a numerical analysis approach predetermined in correspondence with the function of the object, and a numerical analysis condition determined by the user or predetermined as a standard condition.

This system according to the above mode (29) would embody the method according to the mode (1) in a suitable manner, resulting in provision of the same advantageous effects as the method would provide.

This system may be practiced so as to accept a characteristic technology set forth in any one of the above modes (2) to (26).

(30) The system according to the above mode (29), wherein the second means comprises a fourth means for displaying on the screen in association with the displayed generalized model, a figure for supporting the user in graphically entering data for the item.

This system according to the above mode (30) would embody the method according to the mode (8) in a suitable manner, resulting in provision of the same advantageous effects as the method would provide.

(31) The system according to the above mode (29) or (30), wherein the third step comprises a fifth means for graphically displaying on the screen in association with the object, the analysis results.

This system according to the above mode (31) would embody the method according to the mode (12) in a suitable manner, resulting in provision of the same advantageous effects as the method would provide.

(32) A system for supporting a user in mechanically analyzing a performance of an object, using an input device, a display device having a screen for display, and a computer connected to the input device and the display device, comprising:

a first displaying area for graphically displaying on the screen a generalized model which is constructed as a numerical analysis model for the object such that the generalized model has been generalized with respect to at least configuration of a configuration, a structure, and a mechanism, of the object, and has been specialized with respect to a function of the object;

a second displaying area for displaying on the screen in association with the displayed generalized-model, an item for permitting the user to enter data using the input device in order to define a specialized model which is constructed as a numerical analysis model for the object by specializing the displayed generalized model with respect to the at least configuration thereof, and a third displaying area for graphically displaying on the screen in association with the object, in response to the user's entry of the data in association with the displayed item, results from a numerical analysis for the performance of the object.

This system according to the above mode (32) would permit the generalized model serving as a numerical analysis model, to be graphically displayed on the screen, resulting in the user's quick and exact recognition of the generalized model.

In addition, this system would permit an item to be graphically displayed on the screen, which item helps the user to enter data for defining the specialized model by specializing the generalized model, leading to the user's easy entry of data.

Furthermore, this system would contribute to graphical displaying on the screen of results from numerical analysis for the performance of the object, and therefore this system would enable the user to sensuously understand the analysis results, resulting in an improved easiness to evaluate the analysis results.

(33) A system including an input device, a display device having a screen for display, and a computer connected to the input device and the display device, thereby supporting a user in mechanically analyzing a performance of one of a plurality of components of a single product, which one component has been selected by the user, comprising:

a first means for displaying on the screen the plurality of components distinguishably from each other, displaying an indication for permitting the user to select one of the plurality of components as a subject component, and graphically displaying a subject generalized-model corresponding to the subject component which has been selected by the user in response to the indication, the subject generalized-model is one of a plurality of generalized models which are constructed as a plurality of numerical analysis models respectively for the plurality of components, each of which generalized models has been generalized with respect to at least configuration of a configuration, a structure, and a mechanism, of each one of the plurality of components, and has been specialized with respect to a function of the each component;

a second means for displaying on the screen an item for permitting the user to enter data using the input device in order to define a specialized model which is constructed as the numerical analysis model by specializing the displayed subject generalized-model with respect to the at least configuration; and a third means for mechanically analyzing a performance of the subject component, on the basis of the specialized model defined by the data which has been entered by the user in association with the displayed item on the screen, a numerical analysis approach predetermined in correspondence with the function of the subject component, and a numerical analysis condition determined by the user or predetermined as a standard condition.

This system according to the above mode (33) would embody the method according to the mode (16) in a suitable manner, resulting in provision of the same advantageous effects as the method would provide.

(34) A system including an input device, a display device having a screen for display, and a computer connected to the input device and the display device, thereby supporting a user in mechanically analyzing a performance of one of a plurality of components of a single product, which one component has been selected by the user, comprising:

a first displaying area for displaying on the screen the plurality of components distinguishably from each other;

a second displaying area for displaying on the screen an indication for permitting the user to select one of the plurality of components as a subject component;

a third displaying area for graphically displaying a subject generalized-model corresponding to the subject component which has been selected by the user in response to the indication, the subject generalized-model is one of a plurality of generalized models which are constructed as a plurality of numerical analysis models respectively for the plurality of components, each of which generalized models has been generalized with respect to at least configuration of a configuration, a structure, and a mechanism, of each one of the plurality of components, and has been specialized with respect to a function of the each component;

a fourth displaying area for displaying on the screen an item for permitting the user to graphically enter data using the input device in order to define a specialized model which is constructed as a numerical analysis model for the subject component by specializing the displayed subject generalized-model with respect to the at least configuration; and a fifth displaying area for graphically displaying on the screen, in response to the user's data entry with respect to the displayed item on the screen, results from a numerical analysis of a performance of the subject component.

This system according to the above mode (32) would permit the subject generalized-model defined as the generalized model for the subject component, to be graphically displayed on the screen, resulting in the user's quick and exact recognition of the subject generalized-model.

In addition, this system would permit an item to be graphically displayed on the screen, which item helps the user to enter data for defining the specialized model on the basis of the generalized model, leading to the user's easy entry of data.

Furthermore, this system would contribute to graphical displaying on the screen of results from numerical analysis for the performance of the subject component, and therefore this system would enable the user to sensuously understand the analysis results, resulting in an improved easiness to evaluate the analysis results.

(35) A system including an input device, a display device having a screen for display, and a computer connected to the input device and the display device, thereby supporting a user in mechanically analyzing a performance of an object, the improvement of the system comprising:

a construction support means, operable before a specialized model has been defined by the user's converting a generalized model into the specialized model, the generalized model serves as a numerical analysis model for the object, has been generalized with respect to at least configuration of a configuration, a structure, and a mechanism, of the object, has been specialized with respect to a function of the object, and has a plurality of features representing geometrical properties of the object in the form of a node having an attribute thereof and a discrete element having an attribute thereof, the specialized model is obtained by specializing the generalized model with respect to the at least configuration, the construction support means for, in operation, displaying on the screen an indication for supporting the user in producing the specializing model by the user's defining the node and the discrete element using the input device.

This system according to the above mode (35) would provide the same advantageous effects as the method set forth in the mode (17) would provide, according to basically the same principle as one accepted in the method set forth in the mode (17).

(36) A method usable in a system which is constructed by connecting a plurality of computer-based devices each of which includes an input device, a display device having a screen for display, and a computer connected to the input device and the display device, such that the plurality of computer-based devices share a chain-design computer, the method in use to support each one of a plurality of users respectively for the plurality of computer-based devices, in mechanically analyzing a performance of an object which is common to the plurality of users, the object is constructed by a plurality of sub-objects which are associated with each other in configuration, the method comprising:

a first step of displaying on the screen in each one of the plurality of computer-based devices, the plurality of sub-objects distinguishably from each other;

a second step of displaying on the screen in the each computer-based device, an indication for permitting each one of the plurality of users to select one of the displayed plurality of sub-objects on the screen, as a subject sub-object;

a third step of graphically displaying on the screen in the each computer-based device, a subject sub-generalized-model corresponding to the subject sub-object which has been selected by the user in response to the indication, the subject sub-generalized-model is one of a plurality of sub-generalized-models which are constructed as a plurality of numerical analysis models respectively for the plurality of sub-objects, each of which sub-generalized-models has been generalized with respect to at least configuration of a configuration, a structure, and a mechanism, of each one of the plurality of sub-objects, and has been specialized with respect to a function of the each sub-object;

a fourth step of displaying on the screen in the each computer-based device, an item for permitting the each user to enter data using the input device in order to define a sub-specialized-model which is constructed as a numerical analysis model for the subject sub-object by specializing the displayed subject sub-generalized-model with respect to the at least configuration;

a fifth step of mechanically analyzing, in the each computer-based device, a performance of the subject sub-object, on the basis of the sub-specialized-model defined by the data which has been entered by the each user in association with the displayed item on the screen, a numerical analysis approach predetermined in correspondence with the function of the subject sub-object, and a numerical analysis condition determined by the each user or predetermined as a standard condition;

a sixth step usable in the chain-design computer, in response to the each user's data entry using the input device in an attempt to make a design change for the displayed subject sub-object on the screen in the each computer-based device, the sixth step is used to add the attempted design-change, on the basis of the entered data, to at least one of the plurality of sub-objects which is required to be subjected to an associated design-change arising from the attempted design-change; and a seventh step of storing in the chain-design computer, data for defining the at least one of the plurality of sub-objects to which the attempted design-change has been added, such that the plurality of computer-based devices are accessible to the stored data.

In this method according to the above mode (36), an object is constructed by a plurality of sub-objects which are associated with each other in configuration, and a numerical analysis model and a numerical analysis approach have been specialized with respect to a function of each one of the plurality of sub-objects.

Therefore, this method would, like the method according to the mode (16), permit the analysis for individual sub-object to be effected relatively expeditiously by the user's relatively simple operation, compared with the case where both of the numerical analysis model and numerical analysis approach have been improved in general—purpose properties thereof for all the sub-objects.

In addition, in this method, once an original design-change is added to one sub-object, an associated design-change which accompanies the original design-change is automatically added to other sub-object which has been associated with the one sub-object in configuration.

Consequently, this method would make it unnecessary for a user to whom a sub-object has been assigned for designing, to add a design change which accompanies other user's design-change, to the assigned sub-object, each time the other user's design-change is added to other sub-object which has been associated with the assigned sub-object.

As a result, this method would facilitate reduction in the time required for a user to complete design of a sub-object which has been assigned to the user.

The "plurality of sub-objects" in the above mode (36) may be constructed in the form of a plurality of parts which can exist physically apart from each other, or in the form of a plurality of segments constructing a sole product, which segments have been integrally formed.

(37) The method according to the above mode (36), wherein the each computer-based device comprises two computers respectively for supporting the user in the analysis and the design.

This method according to the above mode (37) would permit the analysis and the design for a single sub-object to be conducted by respective computers, resulting in facilitation of parallel progression of these analysis and design, as opposed to the case where these analysis and design are conducted by a single computer.

As a result, this method would facilitate reduction in the time required for a user to complete design and analysis of a sub-object which has been assigned to the user.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown. In the drawings:

FIG. 10 illustrates how step S23 indicated in FIG. 9 is executed;

FIG. 14 illustrates how step S43 indicated in FIG. 12 is executed;

FIG. 23 is a front view showing one example of a spreadsheet of Microsoft Excels referred to in step S225 indicated in FIG. 21;

FIG. 28 is a front view showing one example of a spreadsheet of Microsoft Excels® referred to in step S249 indicated in FIG. 24;

FIG. 32 is a front view showing one example of a spreadsheet of Microsoft Excels® referred to in step S275 indicated in FIG. 29;

DETAILED DESCRIPTION OF THE INVENTION

Several presently preferred embodiments of the invention will be described in detail by reference to the drawings in which like numerals are used to indicate like elements throughout.

First Embodiment

Figure 1:
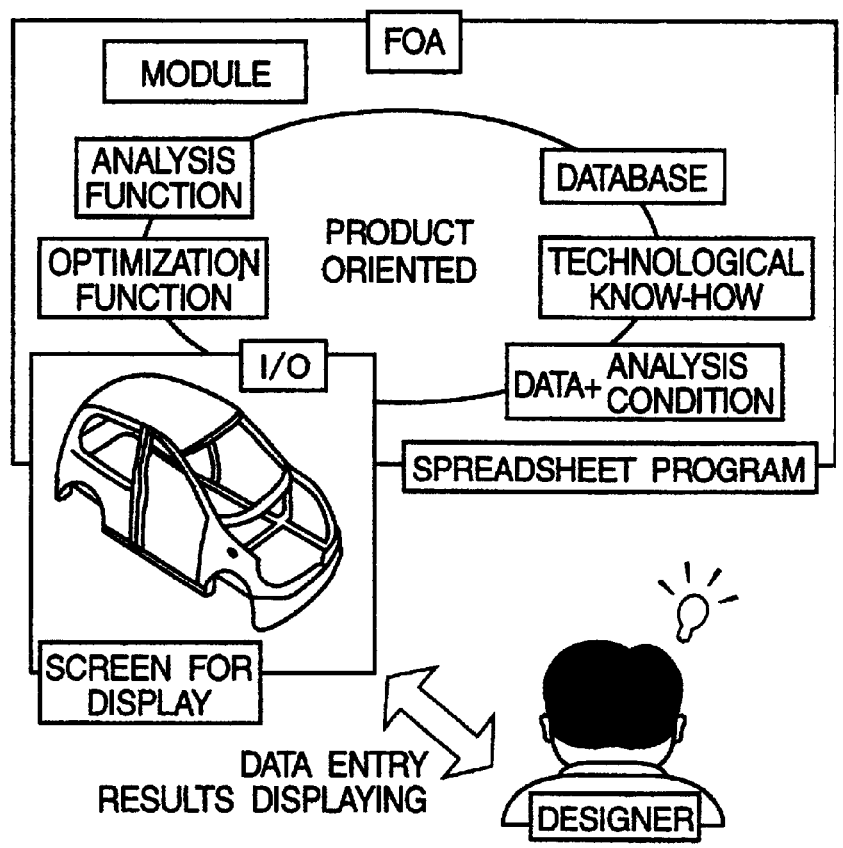
FIG. 1 schematically explains a concept of "First Order Analysis" underlying a performance-analysis-support method constructed according to a first embodiment of the present invention.

Referring first to FIG. 1, there is described a performance-analysis support method constructed according to a first embodiment of the present invention. This method is formulated to support a designer who is designing an automotive body, in effecting a numerical analysis of the performance of the body under design, on the basis of a concept of First Order Analysis (hereinafter abbreviated to as "FOA") which is a new type of CAE.

FOA, which is one type of CAE which is intended mainly for ordinary designers, not professional CAF engineers, is aimed at calculating expeditiously and readily mechanical properties of a product to be designed, namely, an automotive body in this embodiment, under the condition where a geometrical configuration or a topology of the mechanical structure of the product exhibits a change in response to application to the structural geometry of the product, a factor based on an elementary structural-mechanics, a factor based on a dynamics, or otherwise, of the product.

FOA has been established by considering the situation where a designer personally expeditiously makes a change to a design draft, through an interactive communication with a computer, at a stage in which, like at the aforementioned concept design state, analyzing accuracy of the performance of the product is not required as much as when an ordinary CAE is conducted, thereby permitting the designer to newly draft a design-change innovatively different from the previous one.

To this end, FOA is preferably embodied by using such a type of computer as can be easily handled by designers, and by using such a type of graphical interface as can be operated by designers without expertise, so as to serve as a program to be executed by the above type of computer.

However, FOA is not in the position to outperform or replace a conventional CAE, rather, these FOA and the conventional CAE are mutually related complementarily. FOA is for supporting a designer in roughly understanding as to whether the designer's own design-draft is appropriate or not, not in quantitatively or precisely evaluating the performance of the product which is based on the design draft.

Despite of the establishment of FOA, the conventional CAE, which has been conducted in the aforementioned evaluation division, should still play a role of the quantitative evaluation, and therefore the conventional CAE is kept to be in an important position in the flow of a series of operations for product development.

In general, a designer tends to design a product by intensively considering the function to be eventually achieved by the product. In addition, a designer tends, just as the designer requires about designing of the product, to require FOA, which is a new type of CAE, to be oriented to the function of the product.

In view of the above, in this embodiment, there has been introduced an object-oriented idea according to which a product is treated as an object. By introducing the object-oriented idea into FOA, which is a new type of CAE, there is created Product Oriented Analysis (hereinafter abbreviated to as "POA").

On the other hand, there has been known Excels® sold by Microsoft® Corporation as software for permitting the object-oriented idea to be easily realized. The use of Excel® would implement an object-oriented CAE. Additionally, Excels® is software which can be installed in a computer to be used by a designer on the desk, which computer may be a notebook-type personal computer. Furthermore, Excel®, which has been popular among designers, can be thought as software which a designer can use without any special training in advance.

As a result, where Excels® implements POA, an amount of cost which must be invested to software and hardware in order to implement POA, would be capable of being minimized.

In the light of the above, in this embodiment, a spreadsheet of Excel® installed in the notebook-type personal computer which a designer uses on the desk is used as interface between the designer and the notebook-type personal computer.

In addition, in this embodiment, an object-type programming is performed by the use of Excel®. This programming uses, as well known, a plurality of objects. Each object is constructed by capsuling data indicative of an attribute of the each object, and a method meaning a program indicative of a procedure of operations for the data. For the entire of the plurality of objects, classes are constituted by groups of objects each of which groups share attribute and method of the objects.

Described specifically, the plurality of objects have been categorized into a plurality of classes depending on type of the aforementioned numerical analysis model, which is an attribute of each object. Ones of the plurality of numerical analysis models which are common in type are available, not to a plurality of objects different from each other in function, but to a plurality of objects each having the same specific function, because the ones of numerical analysis models have been specialized with respect to the specific function.

Furthermore, Ones of the plurality of numerical analysis models which are common in type are available to a plurality of objects which are common in function, but which are different from each other in their final configurations, because the ones of numerical analysis models have been generalized with respect to an initial configuration of each object (in this embodiment, the configuration means an outer configuration of each object, for example).

However, the final configuration, namely, a specialized configuration of each numerical analysis model is defined by a designer prior to the commencement of a numerical analysis for the corresponding object. The definition is made by model data described below.

As the aforementioned data for each object, analysis data which is data for defining a numerical analysis model corresponding to the each object is used. The analysis data for each object includes the above-mentioned model data for defining the corresponding numerical analysis model, and data representative of a numerical analysis condition under which the corresponding analysis module as described below is restrained. The model data are produced so as to reflect not only a configuration, but also a structure and a mechanism, of the each object.

On the other hand, as the aforementioned method for each object in the aforementioned object-type programming, there are used (a) the aforementioned analysis module (here, a module means each of plurality of functional units together constituting a whole program) for effecting analysis using the corresponding numerical analysis model and the corresponding analysis data, and (b) an optimization module for conducting an optimization design with respect to the structure of the each object.

A plurality of analysis modules have been prepared for the purpose of analyzing the performance of the automotive body as a product to be designed. These analysis modules include: a deformation-analysis module for analyzing a deformation of the body under an external force; a crash-analysis module for analyzing the performance of the body in crash worthiness; and an eigen-value analysis module for analyzing an eigen frequency of the body. These respective analysis modules have accepted different numerical analysis approaches.

On the other hand, the optimization module includes: a cross-section-properties evaluation and design module which is adapted for evaluating and designing properties of a cross-section of the body, and which has been formulated exclusively for automotive design; and a joint evaluation module which is adapted for evaluating a joint of the body.

In this embodiment, as shown in FIG. 1, there have been further prepared: a database in which a plurality of previous design-instances have been stored as technological know-how regarding automotive structures, etc.; and a retrieving module for retrieving from the database at least one of the plurality of previous design-instances which is similar to a product which is to be currently designed, as a result of locating the at least one previous design-instance by specializing the product with respect to function.

This measure on the database and the retrieving module is based on the fact, at a quite early stage during a series of designing process, a designer, in order to sketch, frequently refers to previous design-instances experienced in the same company that the user is working, or information on products manufactured by the competitive companies. In general, these previous design-instances and the information on competitive products have been stored in such a manner that they are specialized or classified with respect to respective functions thereof.

In this embodiment, by making use of these facts, the above measure has been taken.

Therefore, in this embodiment, a designer is capable of conducting, on the basis of the retrieved design-instances, etc. from the aforementioned database, and a pre-prepared numerical analysis approach and numerical analysis condition, using the corresponding analysis module, an evaluation of the mechanical properties of a product which is to be designed, together with operations for the designer to modify the retrieved design-instances, etc. so as to fit the product in question. This shows one of characteristics of FOA which the conventional CAE cannot cover.

It will be clear from the above that, in this embodiment, the initial configuration of the numerical analysis model has been generalized with respect to a configuration of the to-be-designed product, and has been specialized with respect to a function of the to-be-designed product.

In other words, in this embodiment, the numerical analysis model having the initial configuration constitutes one example of the "generalized model" set forth in the mode (1).

It is to be added that, in this embodiment, a plurality of generalized models have been stored in the database of the technological know-how, such that the plurality of generalized models are organized in a hierarchal manner with these models being specialized or classified by respective functions thereof. As a result, the user serving as a designer is capable of retrieving a required generalized-model from the database under the hierarchy thereof.

In this embodiment, the "function" means to include a performance of a product, and further includes easiness to manufacture the product, in terms of a manufacturing technology, which easiness may be associated with the number of procedures for construction, or the construction cost, for instance. Consequently, this embodiment would permit the user to progress design procedures, while referring to data indicative of the performance of the product to be designed, data relating to a construction technology, etc.

Figure 2:
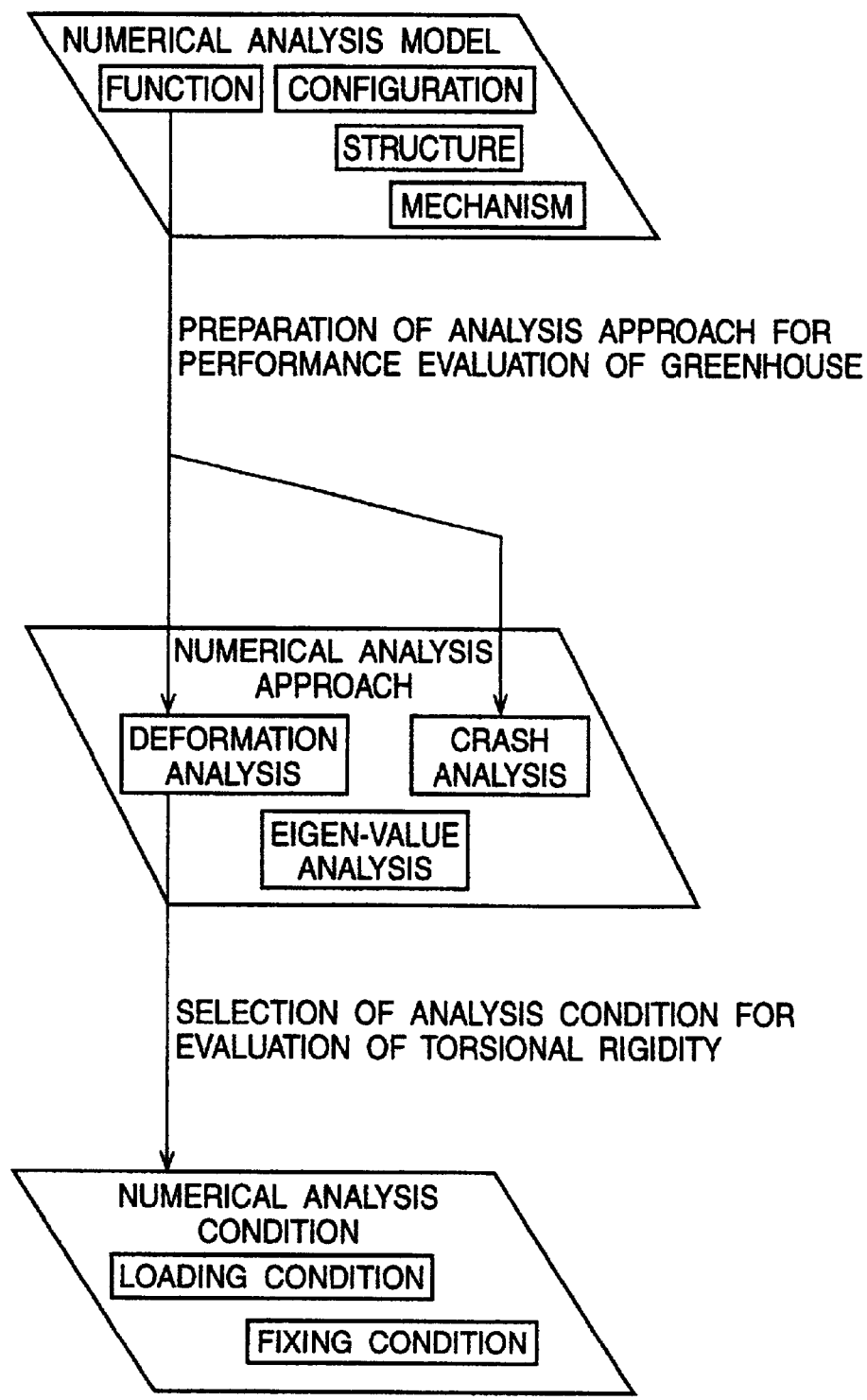
FIG. 2 schematically illustrates a numerical analysis model, a numerical analysis approach, and a numerical analysis condition referred to in the first embodiment.

Referring next to FIG. 2, there are schematically illustrated the numerical analysis model, numerical analysis approach, and numerical analysis condition as described above, such that they are arranged in a hierarchal manner. FIG. 2 representatively shows only one of a plurality of numerical analysis models respectively for a plurality of components (i.e., sub-body-structures) of the automotive body.

In this embodiment, each component corresponds to the object as mentioned above. In addition, each component corresponds to the partial object as mentioned before, while the body corresponds to the whole object as mentioned before.

As shown in FIG. 2, factors of the numerical analysis model include: a function of a component which is represented by the numerical analysis model; and a configuration, a structure, and a mechanism, of the component. In addition, the numerical analysis approach includes, as is evident from the above explanation, the deformation analysis, the crash analysis, and the eigen-value analysis. Furthermore, the numerical analysis condition includes a loading condition relating to a load which is applied to the component, and a fixing condition relating to a condition under which a plurality of elements (e.g., beam elements, and panel elements) of the component are fixed to each other.

To each numerical analysis model, the numerical analysis approach and numerical analysis condition are caused to correspond. The numerical analysis is selected in advance depending on the function of a component represented by the corresponding numerical analysis model. Likewise, the numerical analysis condition is selected in advance depending on the function of a component represented by the corresponding numerical analysis model. However, only a standard numerical-analysis-condition is thus caused to correspond to the numerical analysis model, resulting in permitting the user to customize the numerical analysis condition at will.

Similarly, the structure and the mechanism of the numerical analysis model is selected in advance depending on the function of a component represented by the corresponding numerical analysis model. However, only a standard structure and mechanism is thus selected, resulting in permitting the user to customize the structure and mechanism of the numerical analysis model, at will.

Figure 5:
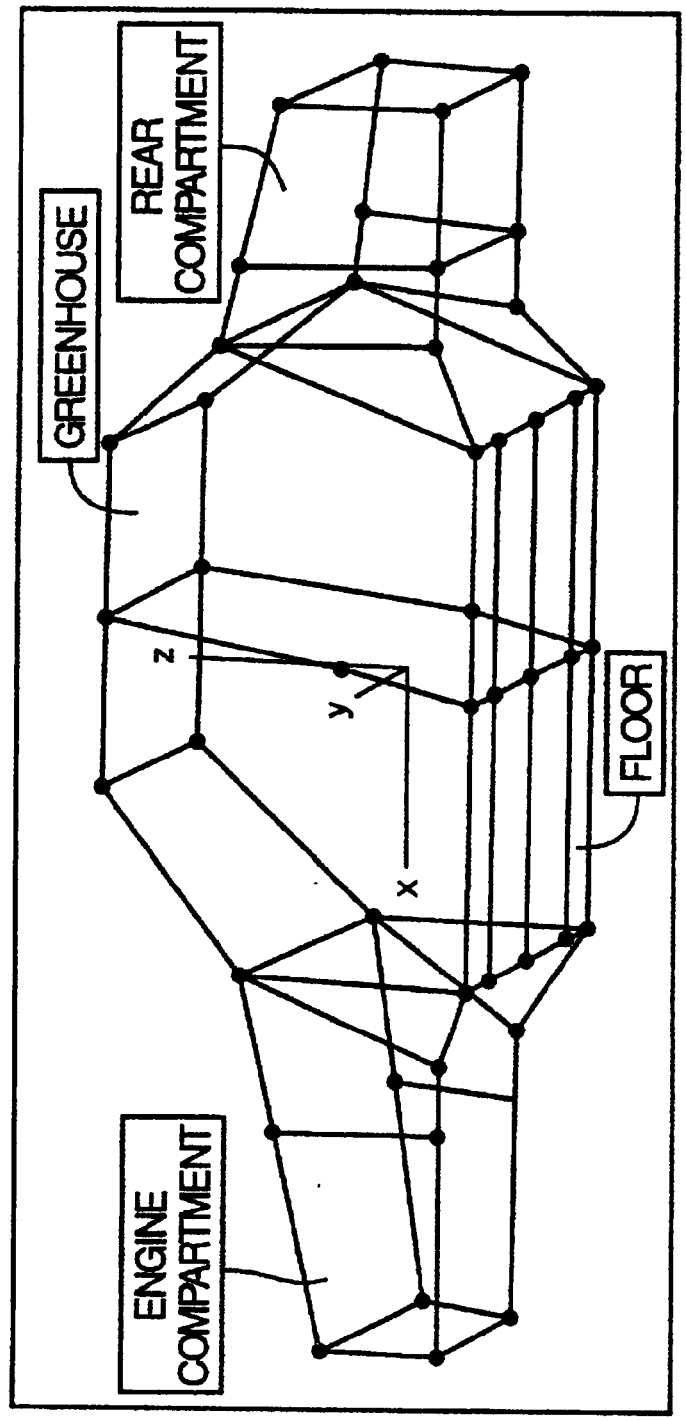
FIG. 5 illustrates how step S1 indicated in FIG. 4 is executed.

As shown in FIG. 5, the automotive body is constructed to include an engine compartment, a greenhouse (i.e., a cabin), a floor, and a rear compartment (i.e., a trunk room), serving as the respective components of the body. As to these components, where the greenhouse has been selected by the user as a subject component (i.e., a currently aimed component), for example, the "deformation analysis" and "crash analysis" are selected as the corresponding numerical analysis approach, as shown in FIG. 2, for example, for the reason that the greenhouse has a function of "accommodating passengers" and "securing passengers' safety." In this case, as shown in FIG. 2, a condition suitable to evaluate a torsional rigidity of the greenhouse is further selected as the corresponding numerical analysis condition.

Figure 3:
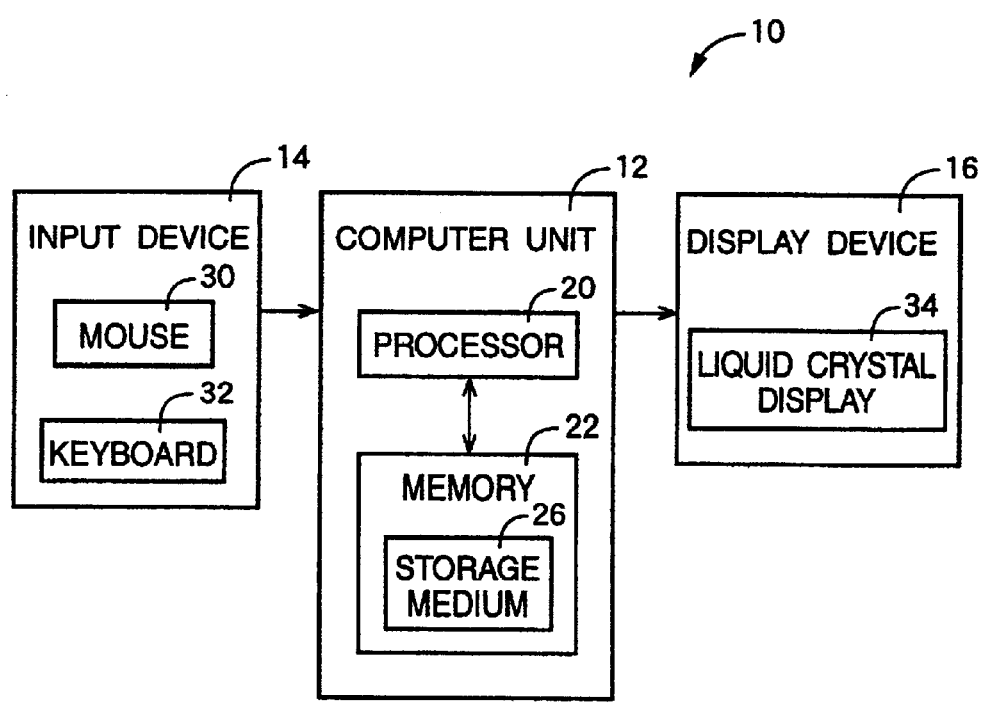
FIG. 3 is a block diagram for schematically illustrating a tool for a user to implement the first embodiment.

Referring next to FIG. 3, there is illustrated a tool for the user to implement the aforementioned performance-analysis-support method constructed according to the present embodiment. This tool is a notebook-type personal computer (hereinafter abbreviated to as PC) 10, a computer unit 12 of which is connected to an input device 14 and a display device 16. This tool may be realized in other type of a computer.

The computer unit 12 is configured such that a processor 20 and a memory 22 are connected with each other. The computer unit 12 includes Microsoft Windows 98® as an operating system, and also includes Microsoft Excel® g as one of applications. Excel® is known as one example of a spreadsheet program.

The memory 22 is configured to include a storage medium 26 which is formed as a hard disc, a CD-ROM, etc. and in which a plurality of programs have been stored. From this memory 22, a selected one of these programs are selectively read out in a suitable manner, and then, the selected program will be executed by the processor 20 as described above. The aforementioned data and methods indicative of attributes of the aforementioned plurality of objects have been also stored in the storage medium 26.

The input device 14 is constructed to include a mouse 30 as one example of a pointing device, and further include a keyboard 32 having a plurality of keys which are operated by the user. The display device 16 is constructed to include a liquid-crystal display (hereinafter referred to simply as "display") 34 which is designed to display such as characters, images, etc. on its screen.

Figure 4:
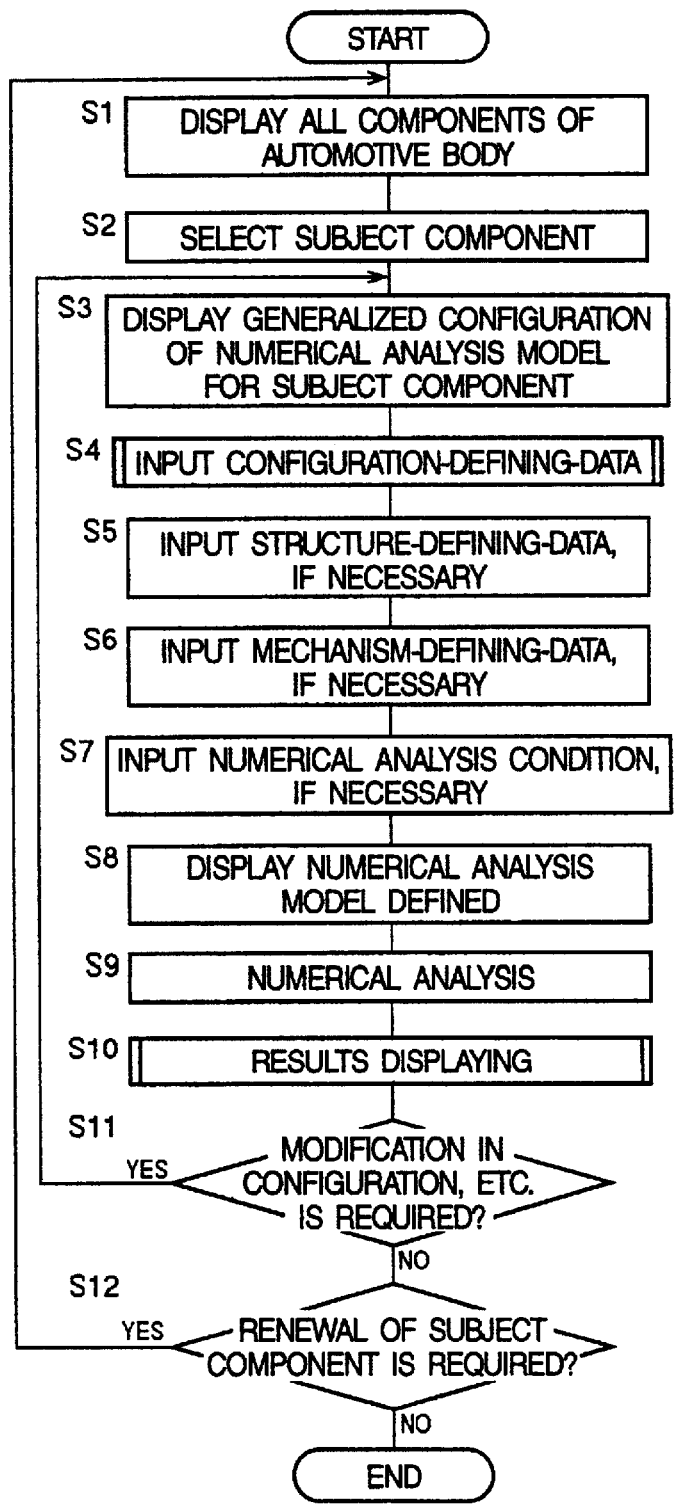
FIG. 4 is a flow chart for schematically illustrating a performance-analysis program to be executed by a computer unit 12 indicated in FIG. 3.

Referring next to FIG. 4, there is illustrated by a flow chart a performance-analysis program which is one of the plurality of programs mentioned above. This performance-analysis program is designed to be initiated in response to an execution-initiation command from the user, and to be retreated until the user generates an execution-termination command.

Each cycle of execution of this performance-analysis program is initiated with step S1 to display on the screen of the display 34 all the components of the automotive body distinguishable from each other, by means of a character (or a string of characters), a symbol (or a string of symbols), or a figure.

FIG. 5 shows one example of such displaying so as to represent an actual image on the screen. In this example, the automotive body is displayed by modeling its initial configuration, i.e., its generalized configuration by means of a combination of a plurality of beam elements and panel elements. The body shown in FIG. 5 is one of the plurality of models which has been retrieved from the aforementioned database as a result of the user's search by specializing the body with respect to the function which the body is required to provide.

Step S1 is followed by step S2 in FIG. 4 to display on the screen of the display 34, an indication for instructing the user to select one of the displayed components as the aforementioned subject component. Described particularly, the user is, as shown in FIG. 5, instructed to click the mouse 30 on a block in which the title of the subject component is displayed on the screen. In response to the indication, the user selects the subject component.

Figure 6:
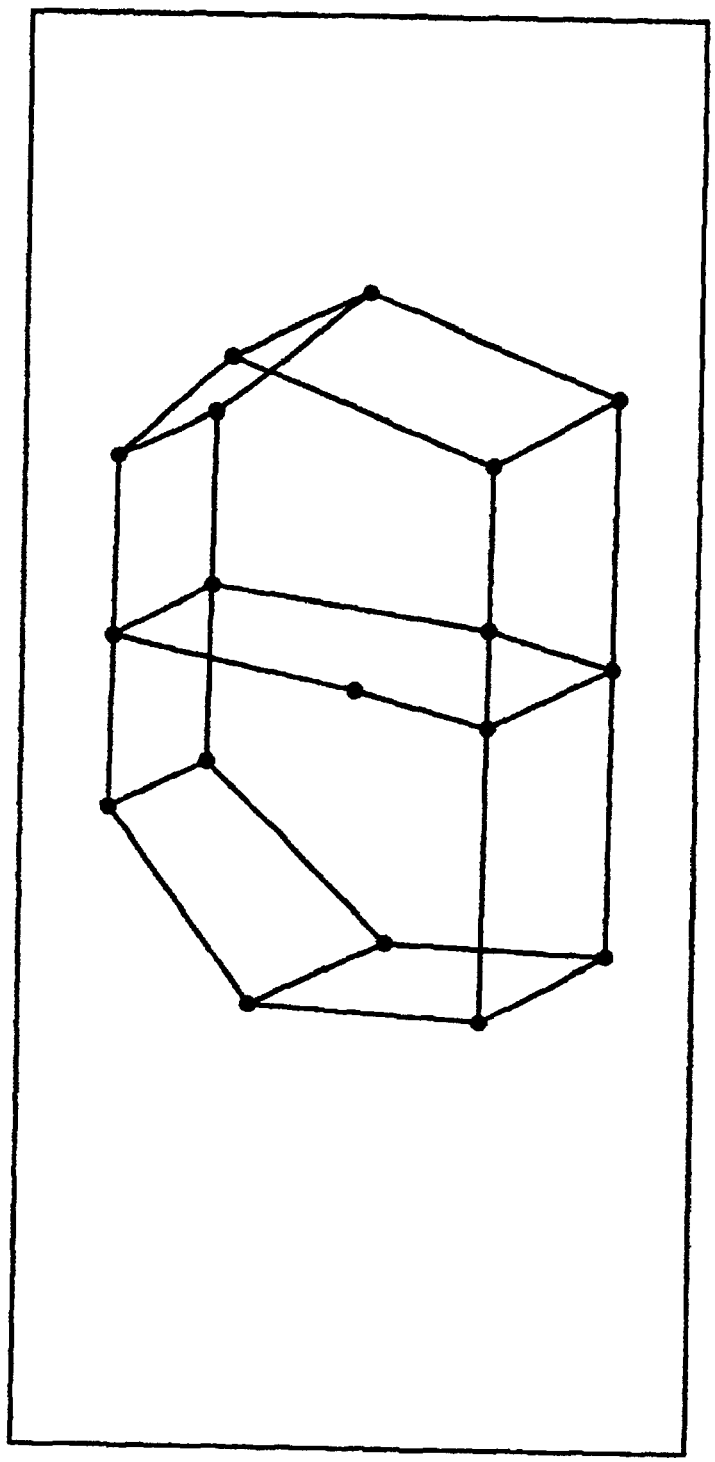
FIG. 6 illustrates how step S3 indicated in FIG. 4 is executed.

Subsequently, in step S3 in FIG. 4, the aforementioned generalized configuration (i.e., the aforementioned generalized model) of a subject numerical-analysis model which is represented by the selected subject component is displayed on the screen of the display 34. In FIG. 6, there is illustrated, in the event where the user has selected the greenhouse of the automotive body as the subject component, how the generalized configuration of the greenhouse is displayed on the screen of the display 34.

Following that, in step S4, data for defining a configuration of the subject numerical-analysis model is input by the user.

Figure 9:
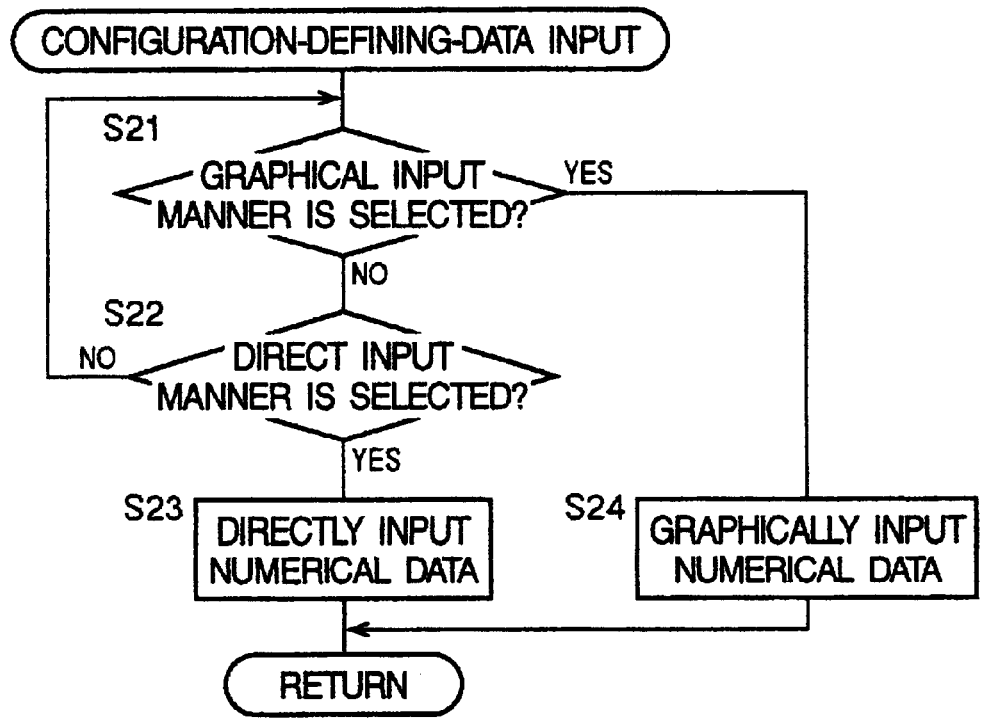
FIG. 9 is a flow chart for illustrating in detail how step S4 indicated in FIG. 4 is executed.

Referring next to FIG. 9, there are illustrated by a flow chart the details of step S4 under the title of configuration-defining-data input routine. This routine is initiated with step S21 to make a determination as to whether the user selected a graphical input manner as a currently aimed data-input manner, by asking the user on the screen of the display 34. If the user selects the graphical input manner, the determination of step S21 becomes affirmative. This routine then proceeds to step S24 where an indication for supporting the user in conducting a graphical input is displayed.

Figure 7:
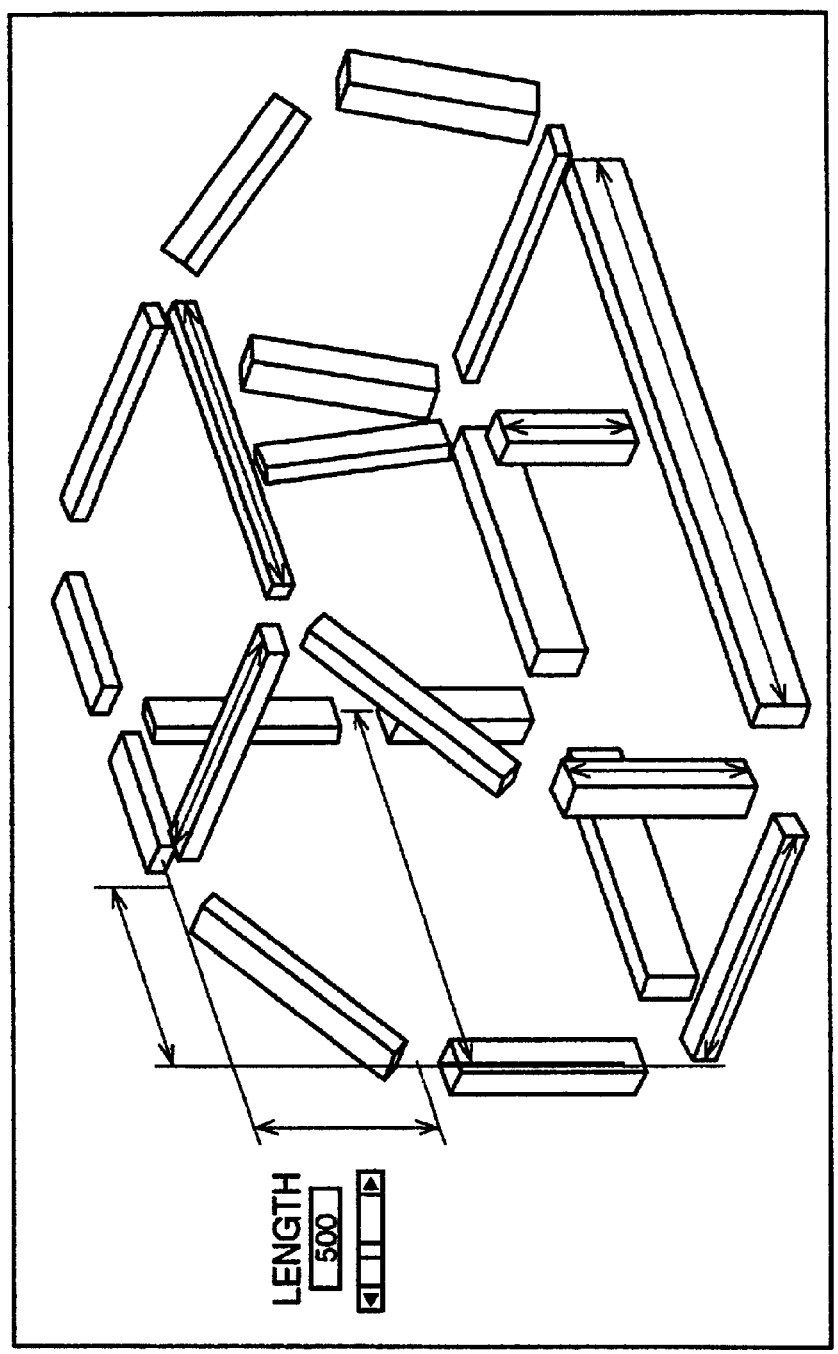
FIG. 7 illustrates how step S24 indicated in FIG. 9 is executed.
Figure 8:
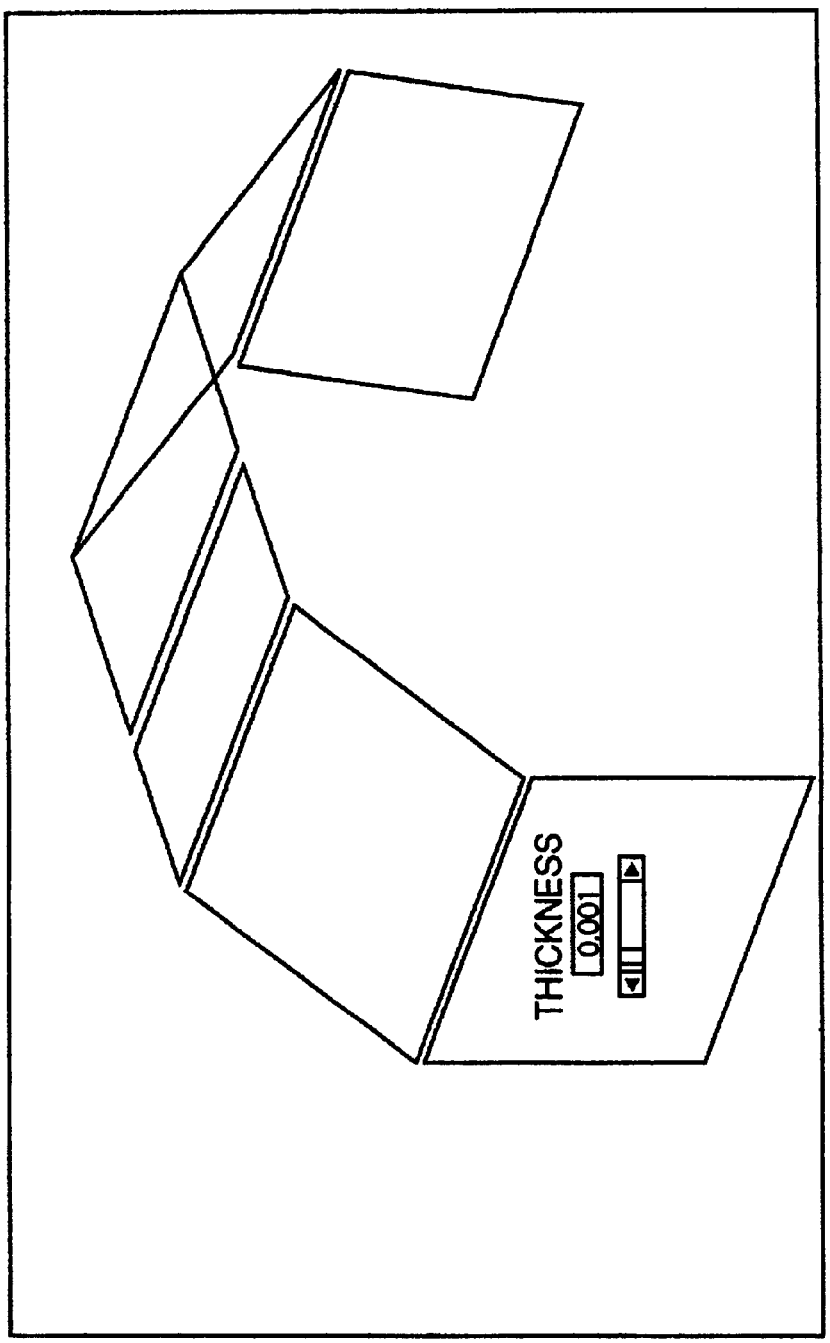
FIG. 8 separately illustrates how step S24 indicated in FIG. 9 is executed.

Referring next to FIGS. 7 and 8, there are illustrated two examples of the indication respectively. One example indicated in FIG. 7 is for supporting the user in inputting values of length for a plurality of beam elements constituting the greenhouse serving as the subject component. Alternatively, the other example indicated in FIG. 8 is for supporting the user in inputting values of thickness for a plurality of panel elements constituting the greenhouse.

In both of the above two examples of the indication, there is displayed on the screen of the display 34 in proximity to each one of a plurality of elements constituting the subject numerical-analysis model, a figure for supporting the user in inputting numerical data relating to an item indicative of a dimension of the each element. In FIGS. 7 and 8, only one figure is illustrated representatively, respectively. In each figure indicated in FIGS. 7 and 8, there are displayed an item for indicating a numerical value, and a scroll-bar which is intended to be moved by the user's operation of the mouse 30, or which is intended to be moved in a selected one of leftward and rightward directions depending on the user's clicking of the mouse 30 on a selected one of two triangles positioned so as to be opposed to each other. In either manner, the numerical value indicated at the item is changed depending on the movement amount of the scroll-bar. Therefore, the user is capable of graphically entering numerical data for defining the configuration of the subject numerical analysis model.

It is evident from the above explanation that, this embodiment is adapted such that, if the user selects the subject component, the generalized configuration of the numerical analysis model corresponding to the selected subject-component is then displayed, and subsequently, if the user selects the graphical input manner, the generalized configuration of the corresponding numerical analysis model is then displayed again, together with the figure for the user's graphical input.

However, the present invention may be alternatively embodied in such a form that, after waiting for the user to select the graphical input manner after selecting the subject component, the generalized configuration of the corresponding numerical analysis model is displayed, together with the figure for the user's graphical input. In this alternative form, the displaying of the generalized configuration of the corresponding numerical analysis model is always concurrent with the displaying of the indication for defining the numerical analysis model.

If the user's graphical input is terminated, one cycle of execution of this configuration-defining-data input routine is terminated.

In contrast, if the user does not select the graphical input manner, the determination of step S21 in FIG. 9 becomes negative, and step S22 is followed to make a determination as to whether the user selected the direct input manner as a currently aimed data-input manner, by asking the user on the screen of the display 34. If the user selects the direct input manner, the determination of step S22 becomes affirmative. This routine then proceeds to step S23 where an indication for supporting the user in conducting a direct input is displayed.

Referring next to FIG. 10, there is illustrated one example of the indication mentioned above. In this example, numbers of a plurality of points at which a plurality of elements constituting the subject numerical analysis model are displayed on the screen of the display 34, and further, items permitting the user to enter three coordinate values, namely, X-, Y-, and Z-coordinate values are displayed in association with the respective numbers. In association with each one of the items, numerical data are entered by the user's operations of the keyboard 32. Therefore, the user is capable of directly inputting numerical data for defining the configuration of the subject numerical analysis model by means of the keyboard 32.

If the user's direct input is terminated, one cycle of execution of this configuration-defining-data input routine is terminated.

On the other hand, if both of the determinations of steps S21 and S22 in FIG. 9 are negative, this routine returns to step S21 to again determine whether the user selected the graphical input manner.

If one cycle of execution of this configuration-defining-data input routine is terminated, the PC 10 proceeds to step S5 in FIG. 4, where the user enters data for defining the structure of the subject numerical analysis model, where appropriate. Described in more detail, the subject numerical analysis model is predetermined such that the number of elements constituting the model, locations of these elements, and the arrangement of these elements have their standard properties, by considering the function of the subject numerical analysis model. However, if the user needs to set different properties with respect to at least one of the number, locations, and arrangement, the user is then required to enter data for defining the at least one of the number, locations, and arrangement such that it has the different properties.

Step S5 is followed by step S6 where the user enters data for defining the mechanism of the subject numerical analysis model, where appropriate. Described particularly, the subject numerical analysis model is predetermined such that an associative state (i.e., a mechanism) in which elements constituting the model are associated with each other has its standard properties, by considering the function of the subject numerical analysis model, wherein one example of the associative state is one relating to allowable relative-movement between those elements. However, if the user needs to set different properties with respect to the associative state, the user is then required to enter data for defining the associative state such that it has the different properties.

By the execution of steps S4 to S6, the definition of the subject numerical analysis model is completed. Consequently, the generalized model is formulated for the subject component such that the model has been specialized or embodied with respect to its configuration, structure, and mechanism, leading to the construction of the specialized model for the subject component.

Step S6 is followed by step S7 where the user enters data for defining a numerical analysis condition to be used for the analysis of the subject numerical analysis model. Described more definitely, the subject numerical analysis model is predetermined such that the numerical analysis condition corresponding to the subject numerical analysis model has its standard properties, by considering the function of the subject numerical analysis model. However, if the user needs to set different properties with respect to the numerical analysis condition, the user is then required to enter data for defining the numerical analysis condition such that it has the different properties.

Figure 11:
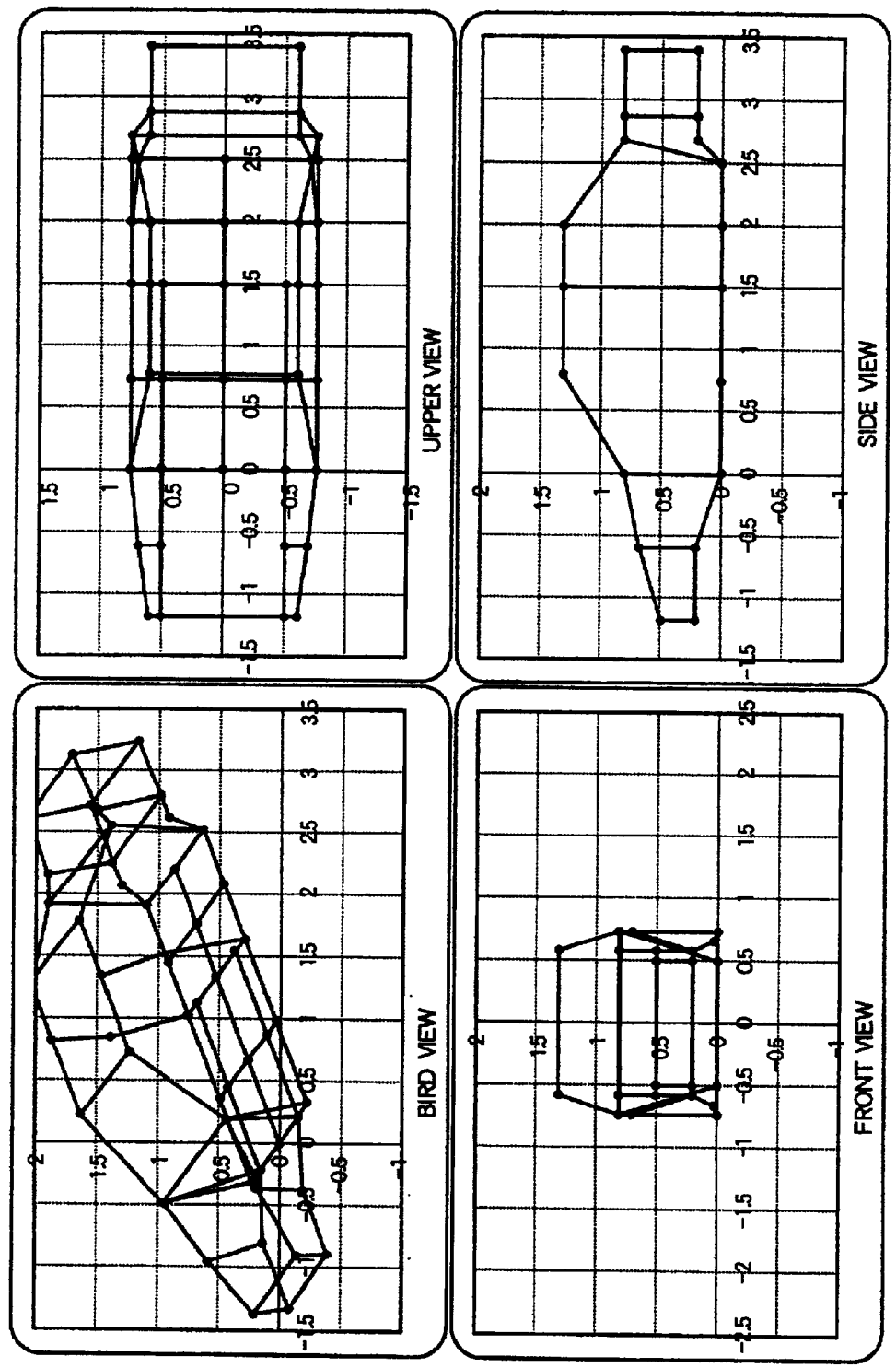
FIG. 11 illustrates how step S8 indicated in FIG. 4 is executed.

The PC 10 then proceeds to step S8 to display the thus defined subject numerical analysis model (i.e., the specialized model) on the screen of the display 34. One example of the displaying is illustrated in FIG. 11. In this example, the subject numerical analysis model is displayed on the screen, together with another numerical analysis model which was previously defined.

Step S8 is followed by step S9 in which the performance of the subject component is mechanically analyzed on the basis of the subject numerical analysis model which has been thus defined with respect to its configuration, structure, and mechanism, the numerical analysis approach, and the numerical analysis condition which has been set by the user or which is predetermined as the standard condition. This analysis is, for example, conducted using Finite Element Method. This analysis can be performed only for the subject component, for a combination of the subject component and its adjacent component, or for the entire of the automotive body.

In this embodiment, the analysis results include mechanical characteristic values taken at each one of a plurality of elements constituting the subject component. The mechanical characteristic values optionally include, for example, a location, a velocity, or an acceleration in motion of the subject component itself or in motion between the plurality of elements of the subject component; an amount of strain energy of the subject component; an amount or its changing rate, of elastic or plastic deformation of the subject component; an acceleration or an amount of energy representative of fracture characteristics, impact absorption characteristics, sensitivity characteristics, etc., of the subject component.

Step S9 is followed by step S10 to display the analysis results on the screen of the display 34.

Figure 12:
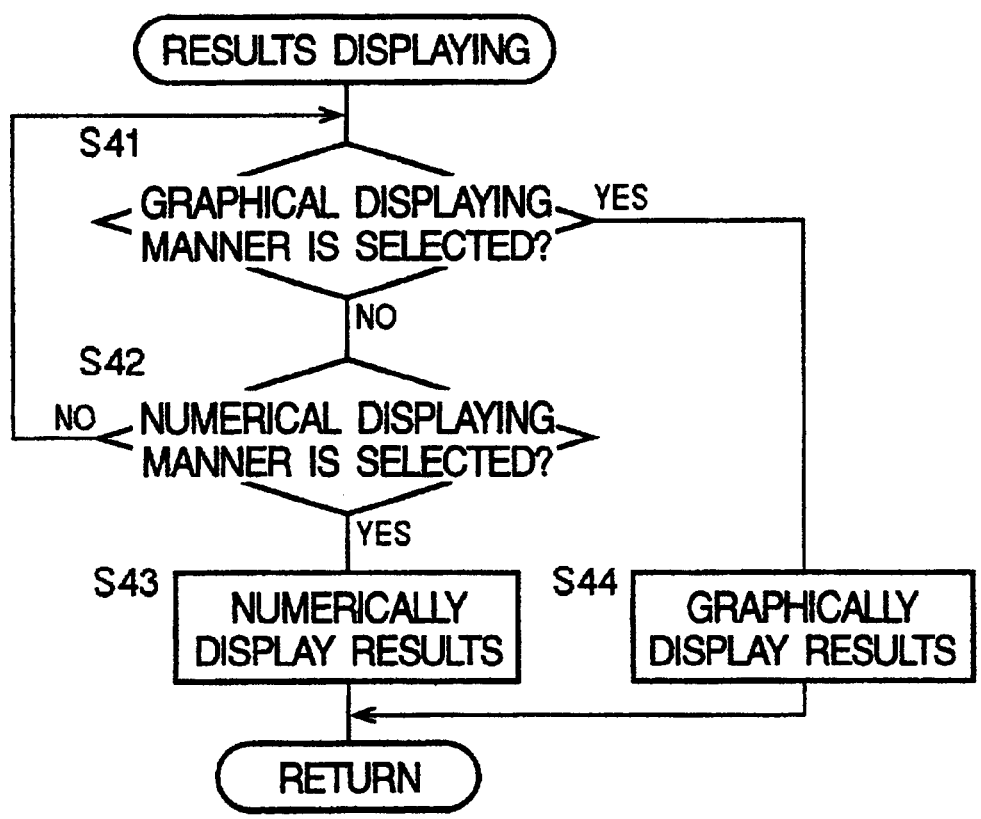
FIG. 12 illustrates in detail how step S10 indicated in FIG. 4 is executed.

The details of step S10 are illustrated by a flow chart in FIG. 12 under the title of "results displaying routine." This routine is initiated with step S41 to make a determination as to whether the user selected a graphical displaying manner as a currently aimed results-displaying manner, by asking the user on the screen of the display 34. If the user selects the graphical displaying manner, the determination of step S41 becomes affirmative. This routine then proceeds to step S44 to graphically display the aforementioned analysis results.

Figure 13:
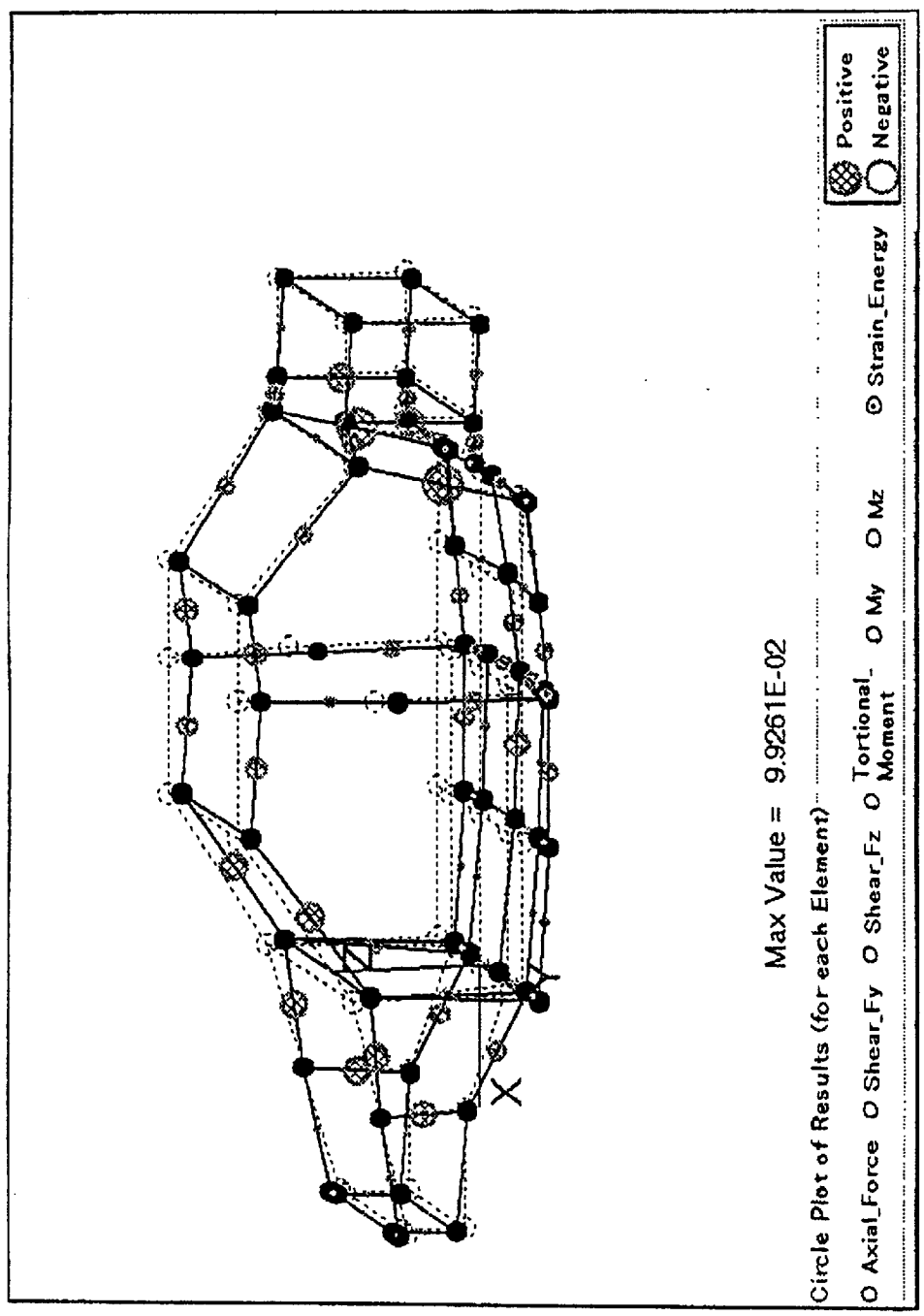
FIG. 13 illustrates how step S44 indicated in FIG. 12 is executed.

Referring next to FIG. 13, there is illustrated one example of the displaying mentioned above. In this example, a representative mechanical-characteristic-value (in this embodiment, a strain energy) reflecting one of the analysis results of each element of the entire domain of the automotive body including the subject component, is graphically displayed on the screen of the display 34 by means of a figure which is adapted to be changed in its size and pattern depending on the magnitude of the representative mechanical-characteristic-value. Specifically, as illustrated in FIG. 13, the figure if formed as a circle which is adapted to become larger in diameter as the representative mechanical characteristic value becomes larger, and is changed in pattern depending on whether the sign of the representative mechanical-characteristic-value is positive or negative.

Although it is not illustrated in any drawings, the above-mentioned figure is further changed in color depending on whether the representative mechanical-characteristic-value deviates from a predetermined allowable-limit for design. In more detail, the figure is changed in color, such as where the representative mechanical-characteristic-value does not deviate from the allowable limit, the figure is blue, while the representative mechanical-characteristic-value deviates from the allowable limit, the figure is red. This would be effective in arousing the user or the designer's attention to at least one of the plurality of elements of the subject component to which the designer is required to add a design change.

If the above graphical displaying of the analysis results is terminated, one cycle of execution of this results displaying routine is terminated.

Alternatively, if the user does not select the above graphical displaying manner, the determination of step S41 in FIG. 12 becomes negative. This routine proceeds to step S42 to make a determination as to whether the user selected a numerical displaying manner as a currently aimed results-displaying manner, by asking the user on the screen of the display 34. If the user selects the graphical displaying manner, the determination of step S42 becomes affirmative. This routine then proceeds to step S43 to display the aforementioned analysis results in the numerical displaying manner.

Referring next to FIG. 14, there is illustrated one example of the displaying mentioned above. In this example, numbers of a plurality of points at which a plurality of elements constituting the subject numerical analysis model are displayed on the screen of the display 34, and further, items permitting the user to enter three coordinate values, namely, X-, Y-, and Z-coordinate values are displayed in association with the respective numbers. In association with each one of the items, the mechanical characteristic value occurring at each point is numerically displayed.

If the above numerical displaying of the analysis results is terminated, one cycle of execution of this results displaying routine is terminated.

On the other hand, if both of the determinations of steps S41 and S42 in FIG. 12 are negative, this routine returns to step S41 to make one more determination as to whether the user selected the graphical displaying manner.

If this results displaying routine is terminated, the PC 10 then proceeds to step S11 in FIG. 11 to make a determination as to whether the user is required to modify the configuration, etc. of the subject component, by asking the user on the screen of the display 34. If the user recognizes the modification to be necessary, and if the user operates the PC 10 in order to convey the user's recognition to the PC 10, the determination of step S11 becomes affirmative, resulting in the PC 10 returning to step S3.

By the following execution of steps S3 to S1, the analysis of the performance of the same subject component as the previous one is conducted, on the basis of a numerical analysis model different in configuration, structure, and mechanism from the previous one, the same numerical analysis approach as the previous one, and the same numerical analysis condition as the previous one or a numerical analysis condition different from the previous one. Otherwise, the analysis is conducted on the basis of the same numerical analysis model as the previous one, the same numerical analysis approach as the previous one, and a numerical analysis condition different from the previous one.

During the repeated executions of steps S3 to S11, if the user recognizes an added modification to the configuration, etc. of the subject component to be unnecessary, and if the user operates the PC 10 in order to convey the user's recognition to the PC 10, the determination of step S11 becomes negative, resulting in the PC 10 proceeding to step S12.

Step S12 is implemented to make a determination as to whether the user is required to renew the subject component such that a currently aimed component is different from the previously aimed component, by asking the user on the screen of the display 34. If the user recognizes the renewal to be necessary, and if the user operates the PC 10 in order to convey the user's recognition to the PC 10, the determination of step S12 becomes affirmative, resulting in the PC 10 returning to step S1. The following execution of steps S1 to S12 permits the analysis of the performance of the different component as the current subject component.

During the repeated executions of steps S1 to S12, if the user recognizes the renewal of the subject component to be unnecessary, and if the user operates the PC 10 in order to convey the user's recognition to the PC 10, the determination of step S12 becomes negative, with the result that one cycle of execution of this performance-analysis program is terminated.

It will be understood from the above explanation that, in this embodiment, each component of the automotive body constitutes one example of the "object" set forth in the mode (1), the PC 10 constitutes one example of a combination of the "input device, display device, and computer" set forth in the same mode. Referring to FIG. 4, step S3 constitutes one example of the "first step" set forth in the same mode, step S4 constitutes one example of the "second step" set forth in the same mode, and steps S5 to S10 together constitute one example of the "third step" set forth in the same mode.

In addition, in this embodiment, step S24 indicated in FIG. 9 constitutes one example of the "fourth step" set forth in the mode (8), one example of the "displaying step" set forth in the mode (9), and one example of the "input support step" set forth in the mode (10). Referring to FIG. 9, step S23 constitutes one example of the "fifth step" set forth in the mode (11), steps S21 and S22 together constitute the "sixth step" set forth in the same mode. Step S44 indicated in FIG. 12 constitutes one example of the "seventh step" in the mode (12), and one example of the "displaying step" set forth in the mode (13).

Further, in this embodiment, referring to FIG. 12, step S43 constitutes one example of the "eighth step" set forth in the mode (14), steps S41 and S42 together constitute one example of the "ninth step" set forth in the same mode. Referring next to FIG. 4, steps S1 to S3 together constitute one example of the "displaying step" set forth in the mode (15), steps S5 to S10 together constitute one example of the "analyzing step" set forth in the same mode. The performance-analysis support method constructed according to this embodiment constitutes one example of the "method" defined by the mode (16).

Furthermore, in this embodiment, the performance-analysis program illustrated in FIG. 4 constitutes one example of the "program" defined by the mode (27), the storage medium 26 constitutes one example of the "computer-readable storage medium" defined by the mode (28).

In addition, in this embodiment, a portion of the computer unit 12 which is assigned for implementing step S3 indicated in FIG. 4, constitutes one example of the "first means" set forth in the mode (29). A portion of the computer unit 12 which is assigned for implementing step S4 indicated in FIG. 4, constitutes one example of the "second means" set forth in the same mode. A portion of the computer unit 12 which is assigned for implementing steps S5 to S10 indicated in FIG. 4, constitutes one example of the "third means" set forth in the same mode. A portion of the computer unit 12 which is assigned for implementing step S24 indicated in FIG. 9, constitutes one example of the "fourth means" set forth in the mode (30). A portion of the computer unit 12 which is assigned for implementing step S44 indicated in FIG. 12, constitutes one example of the "fifth means" set forth in the mode (31).

Further, in this embodiment, an area of the screen of the display 34 in which the image as illustrated in FIG. 6 is displayed, constitutes one example of the "first displaying area" set forth in the mode (32). An area of the screen in which the image as illustrated in FIGS. 7 and 8 is displayed, constitutes one example of the "second displaying area" set forth in the same mode. An area of the screen in which the image as illustrate in FIG. 13 is displayed, constitutes one example of the "third displaying area" set forth in the same mode.

Further to the above correspondence, if this embodiment is viewed from a separate perspective, an area of the screen of the display 34 in which a portion of the image as illustrated in FIG. 8 indicative of the greenhouse is displayed, constitutes one example of the "first displaying area" set forth in the mode (32). An area of the screen in which a portion of the image as illustrated in FIGS. 7 and 8 indicative of the figure for the graphical input is displayed, constitutes one example of the "second displaying area" set forth in the same mode.

In addition, in this embodiment, a portion of the computer unit 12 which is assigned for implementing steps S1 to S3 indicated in FIG. 4, constitutes one example of the "first means" set forth in the mode (33). A portion of the computer unit 12 which is assigned for implementing step S4 indicated in FIG. 4 constitutes one example of the "second means" set forth in the same mode. A portion of the computer unit 12 which is assigned for implementing steps S5 to S10, constitutes one example of the "third means" set forth in the same mode.

In addition, in this embodiment, an area of the screen of the display 34 in which a portion of the image as illustrated in FIG. 5 indicative of the automotive body is displayed, constitutes one example of the "first displaying area" set forth in the mode (34). An area of the screen in which a portion of the image as illustrated in FIG. 5 indicative of the title of each component of the body within each block is displayed, constitutes one example of the "second displaying area" set forth in the same mode. An area of the screen in which the image as illustrated in FIG. 6 is displayed, constitutes one example of the "third displaying area" set forth in the same mode. An area of the screen in which the image as illustrated in FIGS. 7 and 8 is displayed, constitutes one example of the "fourth displaying area" set forth in the same mode. An area of the screen in which the image as illustrated in FIG. 13 is displayed, constitutes one example of the "fifth displaying area" set forth in the same mode.

Further to the above correspondence, if this embodiment is viewed from a separate perspective, an area of the screen in which a portion of the image as illustrated in FIGS. 7 and 8 indicative of the greenhouse is displayed, constitutes one example of the "third displaying area" set forth in the mode (34). An area of the screen in which a portion of the image as illustrated in FIGS. 7 and 8 indicative of the figure for the graphical input is displayed, constitutes one example of the "fourth displaying area" set forth in the same mode.

In addition, in this embodiment, each of the beam and the panel element constitutes one example of the "discrete element" set forth in the mode (2).

Moreover, in this embodiment, every set of data indicative of the generalized model, the specialized model, the numerical analysis approach, and the numerical analysis condition has been constructed in an executable format in which every set of data can be executed by an operating system, namely, Microsoft Windows 98® installed in the PC 10, without causing the PC 10 to execute a special application program.

It is to be added that, in this embodiment, the numerical analysis condition may be defined to include, for example, as shown in FIG. 2, a loading condition under which a load is externally applied to the automotive body, a fixing condition under which one component of the body is fixed to another component of the body, and the like, or under which one component of the body is fixed to a stationary member, such as the ground. The fixing condition influences a degree of freedom in relative motion between those two components.

Second Embodiment

There will be described below a performance-analysis support method constructed according to a second embodiment of the present invention.

Figure 15:
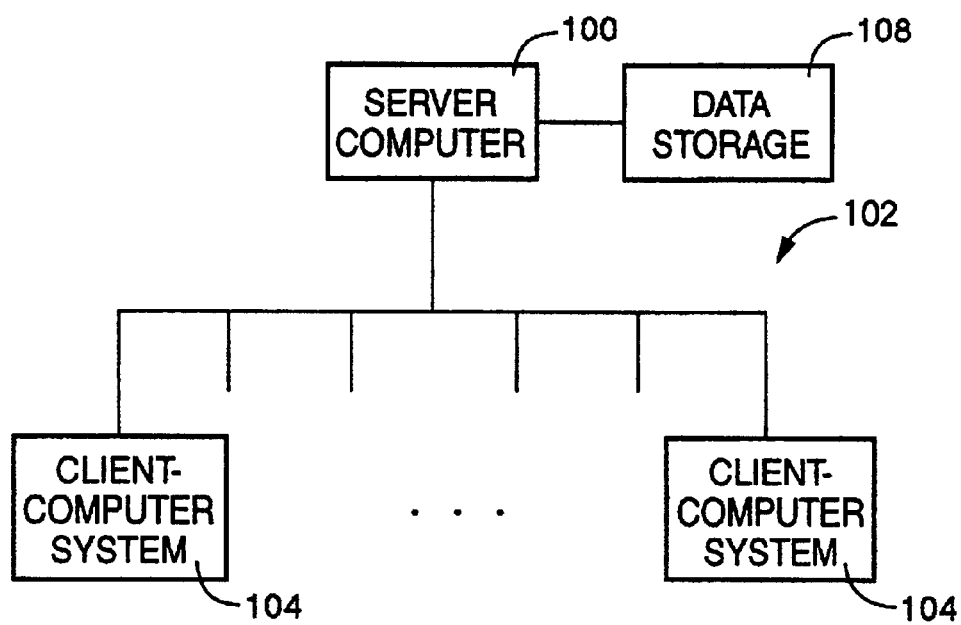
FIG. 15 is a block diagram for illustrating a performance-analysis-support system constructed to suitably embody a second embodiment of the present invention.

Referring to FIG. 15, there is illustrated a performance-analysis support system which is adapted to embody the above-mentioned performance-analysis support method in a suitable manner. This system is employed by a plurality of designers who design a plurality of parts constituting an automotive body.

As shown in FIG. 15, the performance-analysis support system is configured such that a server computer 100 is connected via a communication line 102 to a plurality of client-computer systems 104. A plurality of users for the plurality of client-computer systems 104 mean the above plurality of designers. To the server computer 100, a data storage 108 is connected, in which parts data for defining configurations of the plurality of parts are to be stored. The data storage 108 is shared by the plurality of designers.

Figure 16:
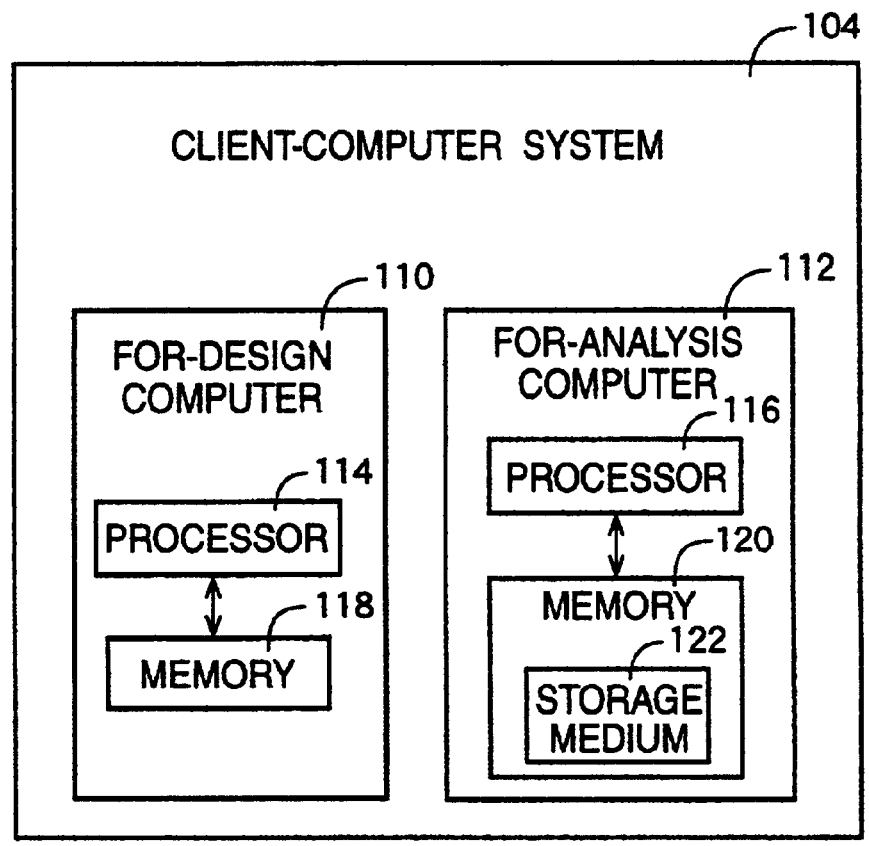
FIG. 16 is a block diagram for schematically illustrating a client-computer system 104 indicated in FIG. 15.

As illustrated in FIG. 16, each client-computer system 104 is equipped with a for-design computer 110 and a for-analysis computer 112. These computers 110, 112 include processors 114, 116, and memories 118, 120, respectively, and each computer 110, 112 is connected to an input device such as a mouse, keyboard, etc., and a display device such as a CRT, a liquid crystal display, etc., as not illustrated in FIG. 16.

Each client-computer system (hereinafter referred to as client computer) 104 is connected to the aforementioned server computer 100 at least at the for-design computer 110. The memory 120 of the for-analysis computer 112 has held at a storage medium 122 installed in the memory 120, the same program (its graphical representation is omitted by referring to FIG. 4) as the performance-analysis program (shown in FIG. 4) used in the above first embodiment. The user of each client computer 104, who is a designer, referring to analysis results obtained by the for-analysis computer 112, designs a part which is assigned to the user, using the for-design computer 110. In this embodiment, each part of the automotive body corresponds to each component set forth in the first embodiment.

Figure 17:
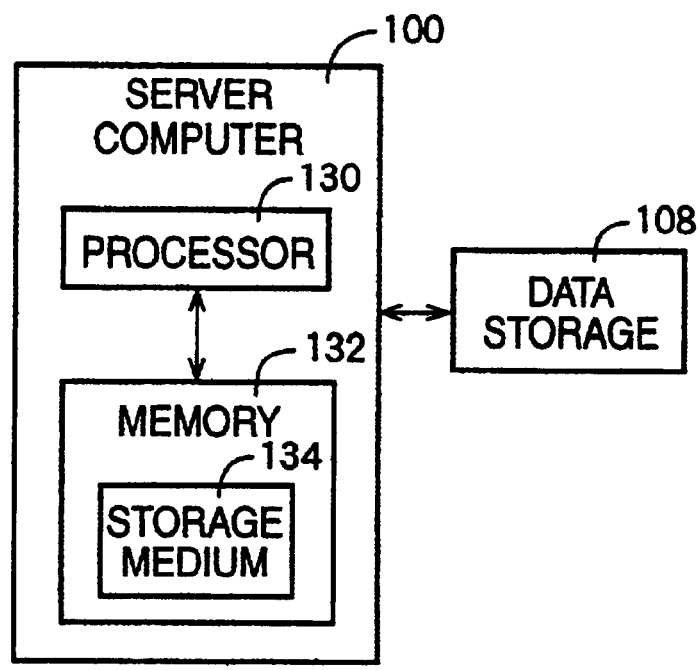
FIG. 17 is a block diagram for schematically illustrating a server computer 100 indicated in FIG. 15.

As shown in FIG. 17, the server computer 100 is configured such that a processor 130 and a memory 132 are connected to each other. The memory 132 is configured to include a storage medium 134 which is formed as a hard disc, a CD-ROM, etc., and in which a plurality of programs have been stored. From this memory 132, any one of these programs is selectively read out in a suitable manner, and then, the selected program will be executed by the processor 130.

Figure 18:
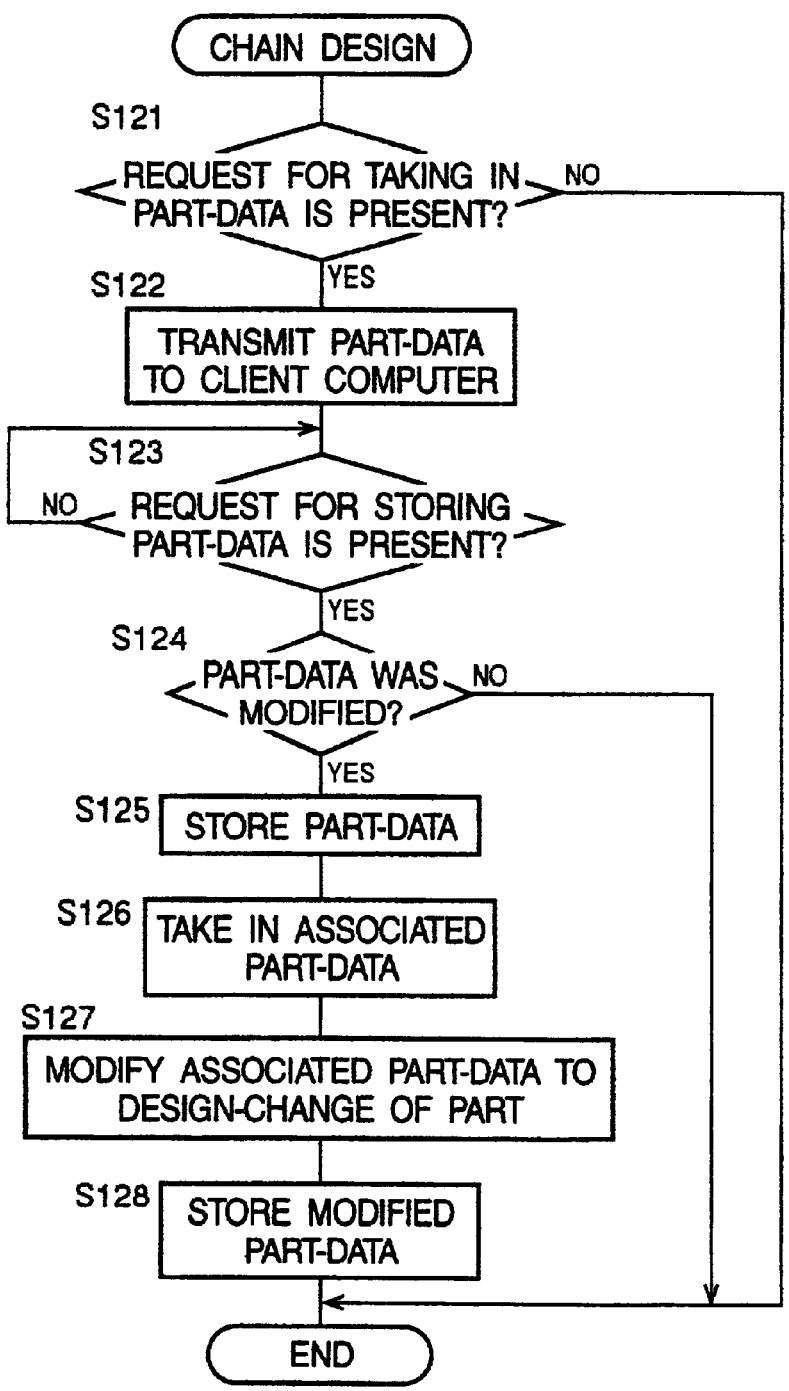
FIG. 18 is a flow chart for schematically illustrating a chain-design program to be executed by the server computer 100 indicated in FIG. 17.

Referring next to FIG. 18, there is illustrated by a flow chart a chain-design program, which is one of those programs. Execution of this program is reiterated while the server computer 100 is powered.

One cycle of execution of the chain-design program is initiated with step S121 to make a determination as to whether any one of the client computers 104 generated an intake request for taking in a certain set of part-data from the data storage 108. If none of the client computers 104 generated the intake request, the determination of step S121 becomes negative, and one cycle execution of this program is directly terminated. Alternatively, if any one of the client computers 104 generated the intake request, the determination becomes affirmative, and this program proceeds to step S122.

Step S122 is implemented to transmit the part data that the user of one of the client computers 104 which generated the intake request requests to take in, from the data storage 108 to the one client-computer 104. Consequently, a designer using the one client-computer 104 is capable of designing a part which has been assigned to the user, using the transmitted part-data.

Subsequently, step S123 is implemented to wait for the one client-computer 104 to generate a storing request for storing into the data storage 108, the part data which the user of the one client-computer 104 has processed.

If the storing request is generated, step S124 is then implemented to make a determination as to whether the content of the part data which is planned to be newly stored into the data storage 108 is different from the content of the part data which is currently stored in the data storage 108. That is, step S124 is implemented to determine whether a designer using the one client-computer 104 added a design change to the part which has been assigned to the user.

If the to-be-stored part-data was not subjected to a design change, the determination of step S124 becomes negative, and one cycle of execution of this program is directly terminated. Alternatively, if the to-be-stored part-data was subjected to a design change, the determination of step S124 becomes affirmative, and this program proceeds to step S125.

Step S125 is implemented to store the aforementioned part-data into the data storage 108, whereby the content of the part-data stored in the data storage 108 is updated. Following that, step S126 is implemented to take in from the data storage 108, other part-data associated with the updated part-data.

Described specifically, once a designer modifies the configuration of a part assigned to the designer, part-data defining the configuration of other part which will be required to be accordingly modified in configuration, is then determined to be the aforementioned associated part-data. For the automotive body indicated in FIG. 5, for example, where the part to which a designer added a design change is the greenhouse, every one of the engine compartment, floor, and rear compartment is determined to be a part associated with the body.

Step S126 is followed by step S127 wherein the associated part-data are modified such that the associated part is changed in configuration by accompanying the design change which has been added to the part which has been assigned to the designer. In more detail, the associated part-data are modified such that one part represented by the associated part-data and other part subjected to a design change are coupled or engaged with each other so as to maintain their positional relationship or their relative displacement between before and after the design change.

Afterward, step S128 is implemented to store into the data storage 108, the associated part-data which has been thus modified, whereby the data storage 108 is updated with respect to the associated part-data. Then, one cycle of execution of this chain-design program is terminated.

It will be understood from the above explanation that, in this embodiment, the automotive body constitutes one example of the "object" set forth in the mode (36), and each component of the body constitutes one example of the "sub-object" set forth in the same mode. The client computer 104 constitutes one example of the "computer-based device" set forth in the same mode, and the server computer 100 constitutes one example of the "chain-design computer" set forth in the same mode.

In addition, in this embodiment, referring to FIG. 4, step S1 constitutes one example of the "first step" set forth in the mode (36), step S2 constitutes one example of the "second step" set forth in the same mode, step S3 constitutes one example of the "third step" set forth in the same mode, step S4 constitutes one example of the "fourth step" set forth in the same mode, and steps S5 to S10 together constitute one example of the "fifth step" set forth in the same mode. Referring next to FIG. 18, steps S121 to S127 together constitute one example of the "sixth step" set forth in the same mode, and steps S125 and S128 together constitute one example of the "seventh step" set forth in the same mode.

Furthermore, in this embodiment, the for-design computer 110 and the for-analysis computer 112 together constitute one example of the "two computers" set forth in the mode (37).

Third Embodiment

There will be described a third embodiment of the present invention. Since most of the elements used in the third embodiment are similar to those of the first embodiment, and since the third embodiment differs from the first embodiment only with respect to construction of the generalized models, only such features that are characteristic of the third embodiment will be explained in detail, while the same reference numerals and titles as used in the first embodiment will be used to identify the similar elements, instead of explaining the similar elements in detail.

Figure 19:
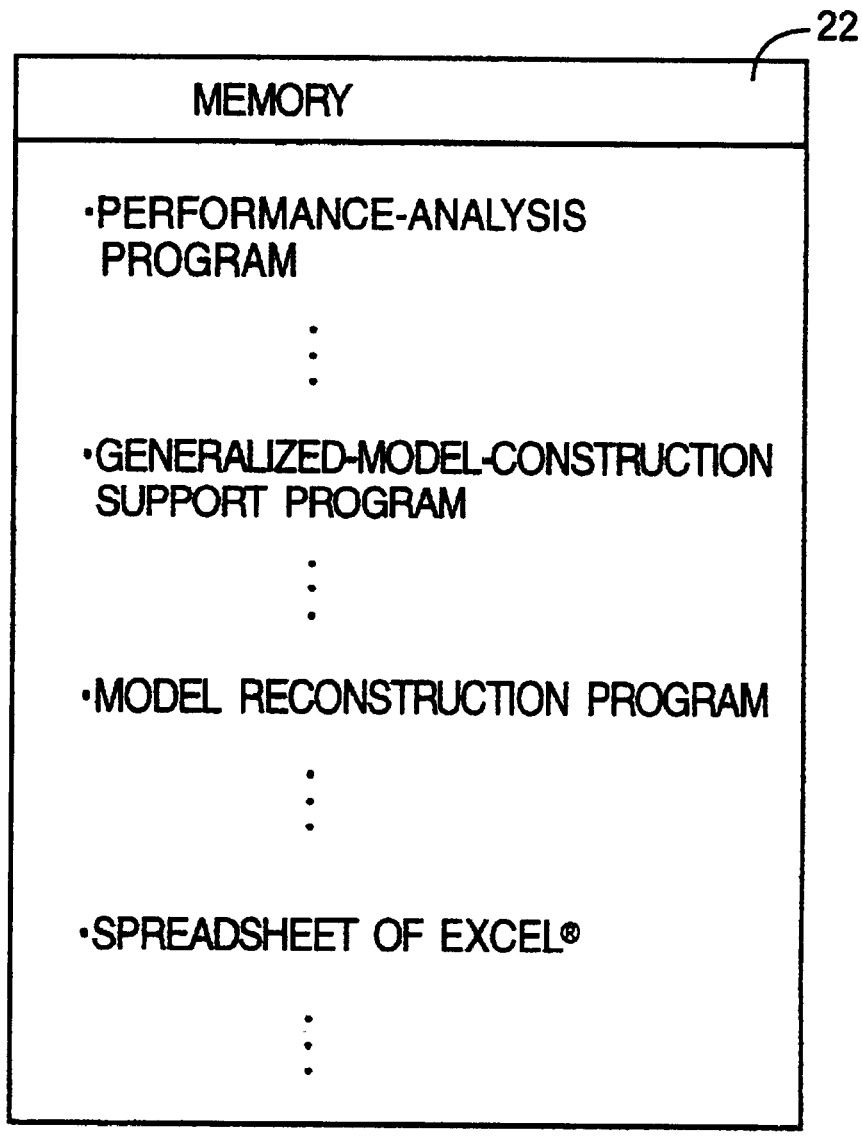
FIG. 19 is a block diagram for illustrating a memory of a computer installed in a performance-analysis-support system constructed to suitably embody a third embodiment of the present invention.

As shown in FIG. 19, the computer unit 12 used in this embodiment is configured to include the memory 22, which contains the storage medium 26. In the storage medium 26, a performance-analysis program has been stored, which program is the same program as the performance-analysis program used in the first embodiment. Further, in the storage medium 26, a memory portion at which the content of the spreadsheet of Excel® is to be stored, has been formed.

As shown in FIG. 19, the storage medium 26 has further held a generalized-model-construction support program, and a model reconstruction program.

Described generally, the generalized-model-construction support program is implemented by the computer unit 12 in order to support the user in personally producing on the computer unit 12 the generalized model.

Alternatively, the model reconstruction program is formulated to be executed by the computer unit 12 in order to automatically reproduce the same generalized-model that was previously produced by the user.

More specifically, this model reconstruction program is implemented to store into the memory 22 as a template, a history of operations which the user conducted for the computer unit 12 in order to produce a certain generalized-model by execution of the generalized-model-construction support program. After storing, this model reconstruction program is implemented to read out, in response to a reconstruction command from the user, the template from the memory 22, and subsequently, to cause the computer unit 12 to execute the generalized-model-construction support program with the template.

As a result, the same generalized-model that was produced by the user's previous operations is automatically reproduced.

Figure 20:
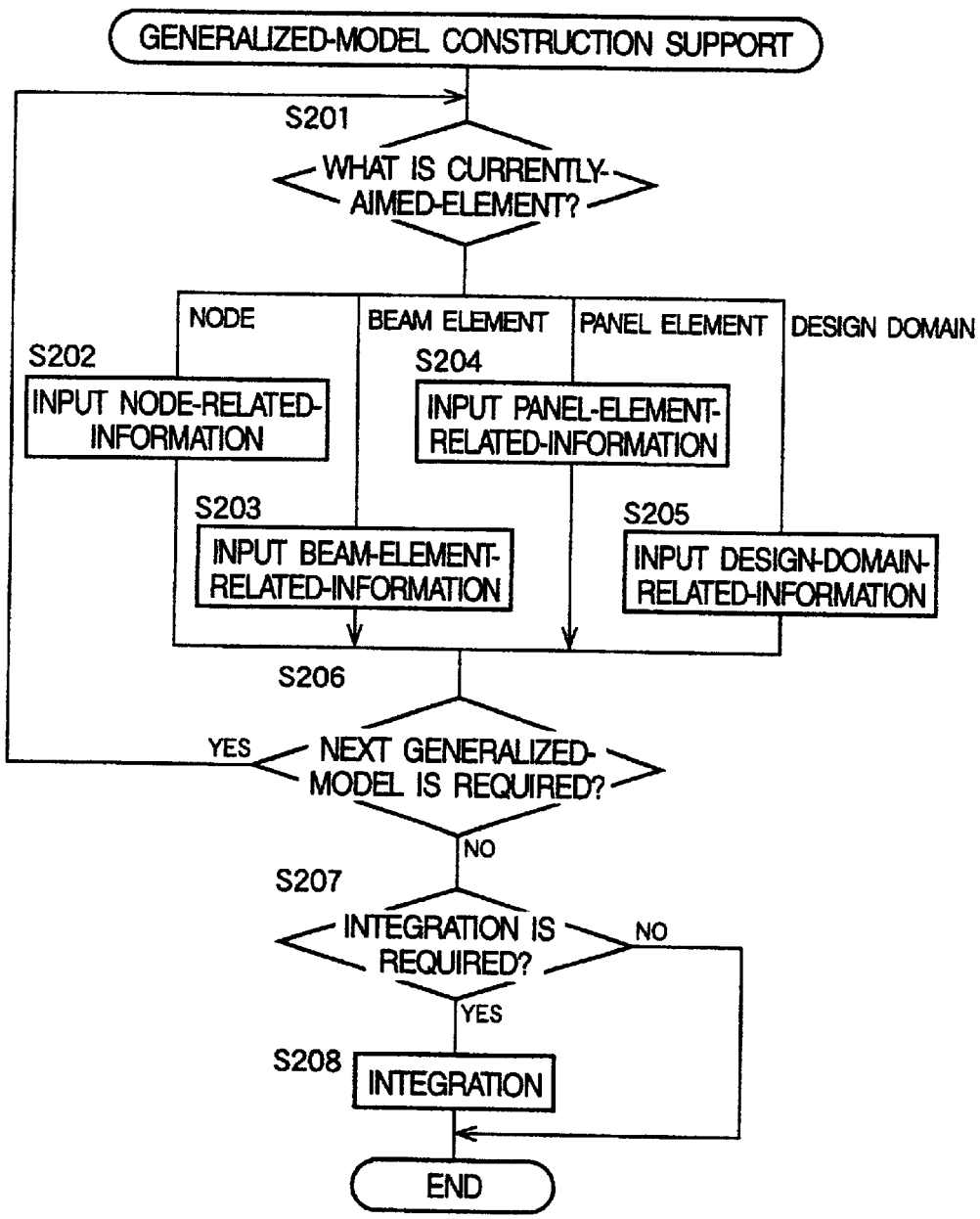
FIG. 20 is a flow chart for schematically illustrating a generalized-model construction support program indicated in FIG. 19.

Referring then to FIG. 20, there is schematically illustrated by a flow chart the generalized-model-construction support program.

This generalized-model-construction support program is activated in response to a specific command from the user. This program is initiated with step S201 wherein the user selects one of a plurality of elements constituting a generalized model presently attempted to be produced by the user, as a currently aimed element. The generalized model is constructed to include as its elements, in general, at least one of some nodes, some beam-elements, some panel-elements, and some design-domains.

The design-domain is defined as a domain of the generalized model which is planned to be constructed by a combination of a plurality of beam elements, and a structure of which is intended to be designed by topology optimization.

Suppose that the user selects one node as the currently aimed element, step S202 is implemented wherein the user inputs node-related-information with the support of the computer unit 12.

Figure 21:
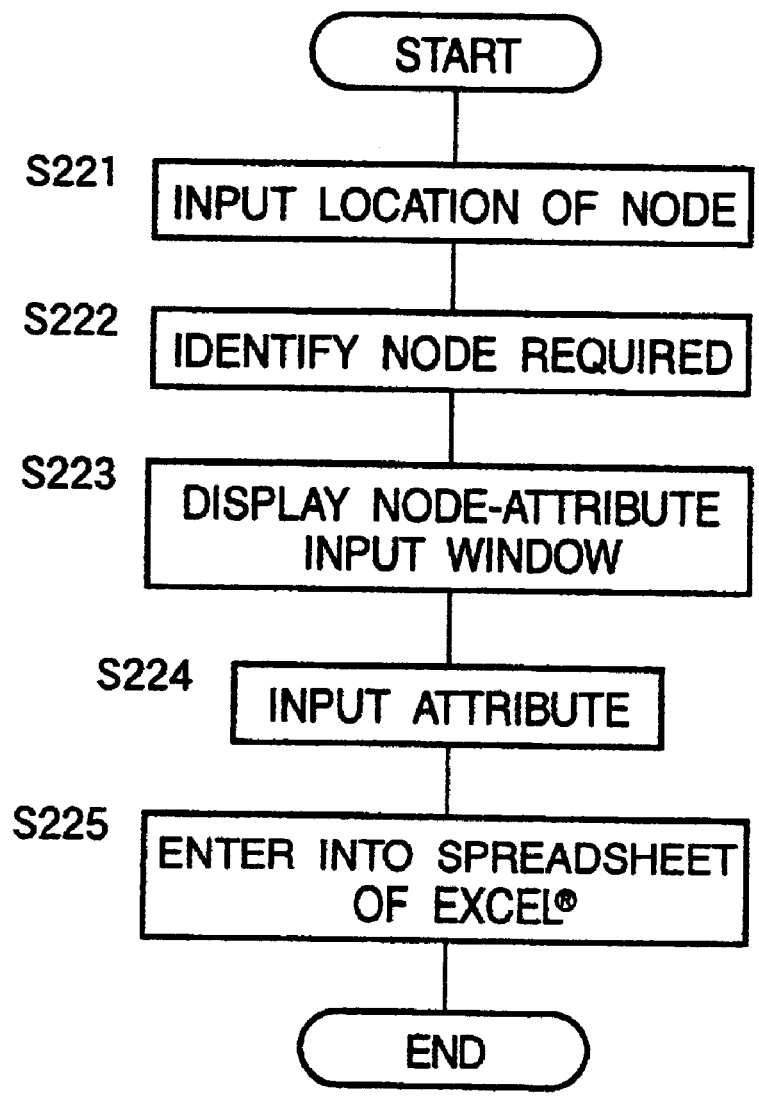
FIG. 21 is a flow chart for schematically illustrating the details of step S202 indicated in FIG. 20 under the title of node-related-information input support routine.

In FIG. 21, there are schematically illustrated by a flow chart the details of step S202 under the title of "node-related-information input support routine."

This node-related-information input support routine is initiated with step S221 wherein a location of one node to be set is inputted, depending on the user's operations via the input device 14. The location input may be performed, by an action that the user clicks the mouse 30 at any point on the screen of the display device 16, or by an action that the user inputs in the form of numerical values, coordinate values defining the location of the one node, and the like, for example.

Upon completion of the location input with respect to the one node, a node figure graphically representative of the presence of the one node at the location of the node figure, is displayed at a location on the screen corresponding to the inputted location of the one node. The node figure may be a single circle, for example.

It is added that step S221 may be repeatedly executed for a plurality of nodes to be set.

Step S222 is subsequently implemented wherein the user identifies any one of at least one node which has been thus set in location. The identification may be performed by an action that the user clicks the mouse 30 at any node-figure on the screen, for example.

Following that, step S223 is implemented to automatically display on the screen a node-attribute input window, in response to the above-mentioned identification of the one node. This node-attribute input window is one example of the "first support indication" set forth in the mode (18), for example. One example of the node-attribute input window is illustrated in FIG. 22.

Figure 22:
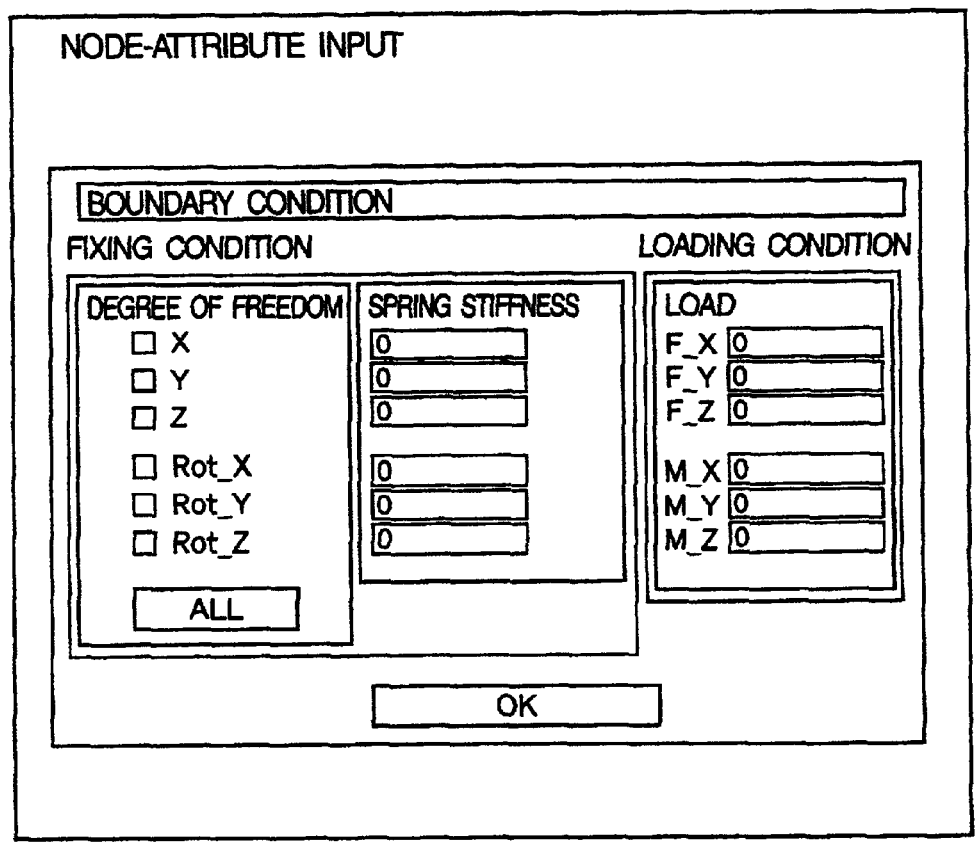
FIG. 22 is a front view showing one example of a node-attribute input window referred to in step S223 indicated in FIG. 21.

In this example indicated in FIG. 22, the attribute of the identified node includes its boundary condition. The boundary condition includes a fixing condition and a loading condition. The fixing condition is defined to include: a degree of freedom of the identified node during its translation in each direction parallel to each coordinate axis X, Y, and Z; a degree of freedom of the identified node during its rotation about each coordinate axis X, Y, and Z; a spring stiffness of the identified node in each of the directions of the above translation and rotation. The loading condition is defined to include: an axial force acting in each direction parallel to each coordinate axis X, Y, and Z; and a moment occurring about each coordinate axis X, Y, and Z.

Then, step S224 indicated in FIG. 21 is implemented wherein the attribute of the identified node is inputted, on the displayed node-attribute input window, depending on the user's operations via the input device 14.

Subsequently, step S225 is implemented wherein the inputted data indicative of the attribute is entered into the spreadsheet of Excel® s in association with the identified node, whereby the inputted data is stored therein.

One example of the content of the spreadsheet is illustrated in FIG. 23. In the spreadsheet, coordinate values indicative of locations, and attributes are stored in association with the identified node, and it follows that the aforementioned generalized-model is defined by the stored data in the spreadsheet.

Then, one cycle of execution of this node-related-information input support routine is terminated.

There was described above this embodiment in the case where the user selects one node as the currently aimed element, and alternatively, there will be described below this embodiment in the case where the user selects one beam element as the currently aimed element.

In this case, step S203 indicated in FIG. 20 is implemented wherein the user inputs beam-element-related-information with the support of the computer unit 12.

Figure 24:
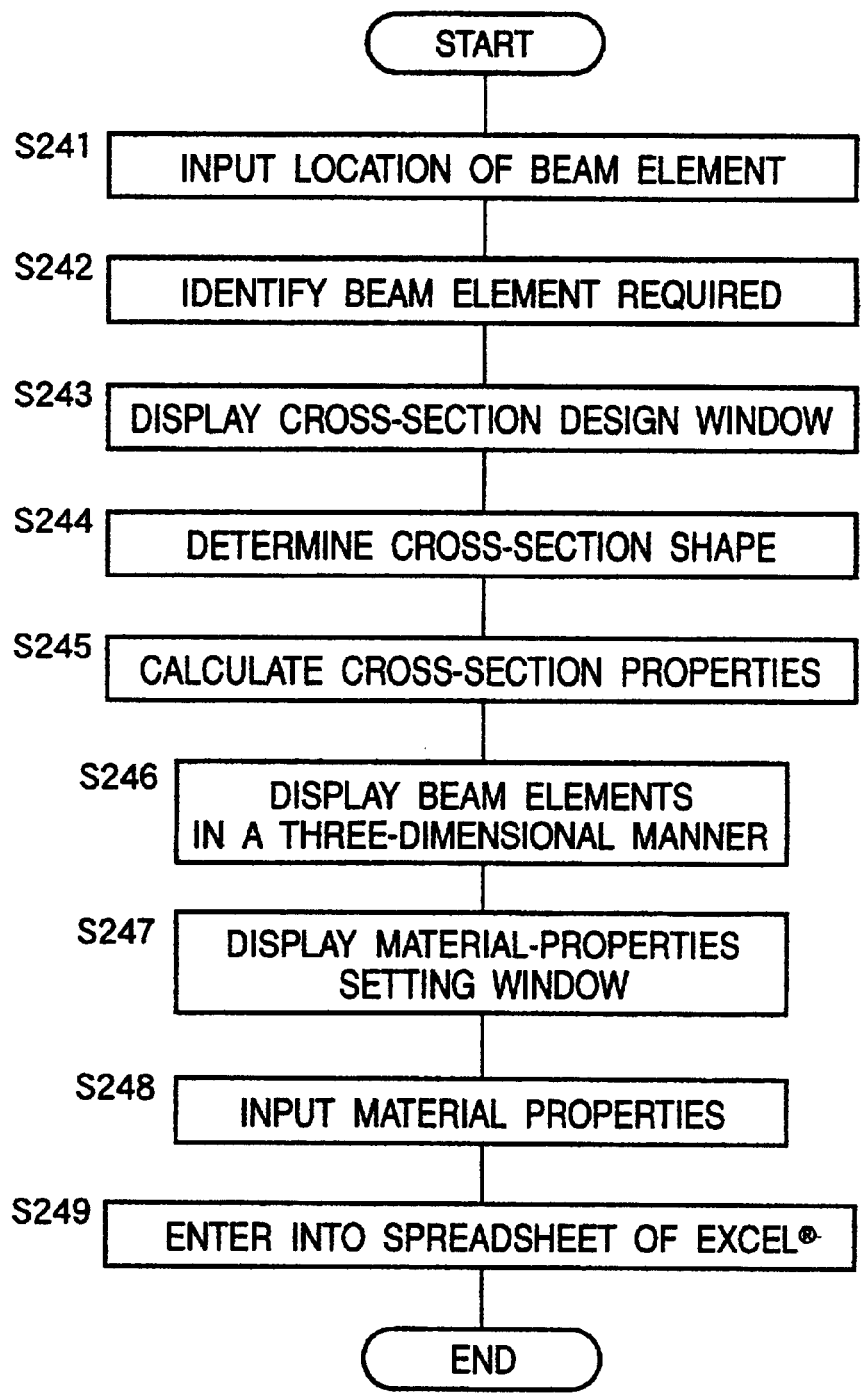
FIG. 24 is a flow chart for schematically illustrating the details of step 203 indicated in FIG. 20 under the title of beam-element-related-information input support routine.

In FIG. 24, there are schematically illustrated by a flow chart the details of step S203 under the title of beam-element-related-information input support routine.

This beam-element-related-information input support routine is initiated with step S241 wherein, like in step S221 indicated in FIG. 21, a location of a beam element to be set is inputted, depending on the user's operations via the input device 14.

Upon completion of the location input with respect to the one beam element, a beam-element figure graphically representative of the presence of the beam-element at the location of the beam-element figure, is displayed at a location on the screen corresponding to the inputted location of the one beam element. The beam-element figure may be a single line, for example.

It is added that step S241 may be repeatedly executed for a plurality of beam elements to be set.

Step S242 is subsequently implemented wherein the user identifies any one of at least one beam element which has been thus set in location. The identification may be performed by an action that the user clicks the mouse 30 at any beam-element figure on the screen, for example.

Following that, step S243 is implemented to automatically display on the screen a cross-section-design window. This cross-section-design window is one example of the "second support indication" set forth in the mode (18), for example. One example of the cross-section-design window is illustrated in FIG. 25.

Afterward, step S244 indicated in FIG. 24 is implemented wherein a cross-section shape of the identified beam-element is determined, depending on the user's operations via the input device 14. The thus determined cross-section shape is graphically displayed on the screen.

Figure 25:
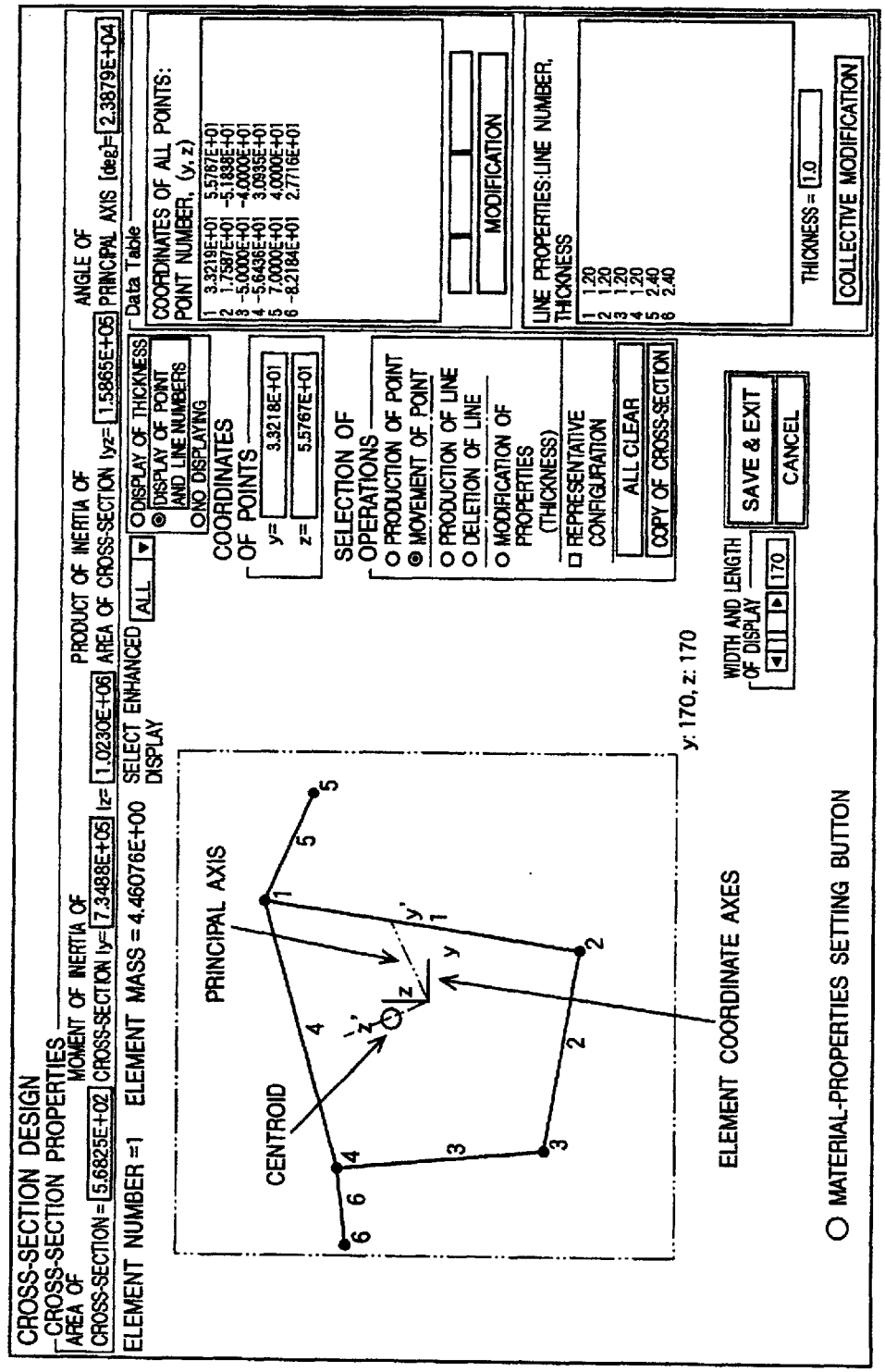
FIG. 25 is a front view showing one example of a cross-section-design window referred to in step S243 indicated in FIG. 24.

In FIG. 25, there is illustrated one example of the thus determined cross-section shape. In this example, an inner space is formed by being closed with a combination of a plurality of panels, such that the inner space is continuously extended in a direction in which a beam element is extended, namely, a direction perpendicular to the plane of FIG. 25.

Step S244 is further implemented, in the case where the identified beam element is constructed by a panel, to permit the user to input a value of thickness of the panel.

Subsequently, step S245 indicated in FIG. 24 is implemented to automatically determine directions of z- and y-axes of element coordinate system which is defined as a local coordinate system for the identified beam element, on the basis of data indicative of the determined cross-section shape mentioned above. The element coordinate system is formulated as an orthogonal one defined by x-, y-, and z-axes, such that it is positioned relative to the identified beam element with the direction of the x-axis being in agreement with the neutral axis of the identified beam element. The thus determined y- and z-axes of the element coordinate system are also displayed one the screen.

Step S245 is further implemented to calculate cross-section properties of the identified beam element, on the basis of data indicative of the determined cross-section shape and data indicative of the thickness. The cross-section properties to be calculated include: as shown in FIG. 25, for example, the centroid of the cross section as shown in FIG. 25 by means of an open circle; an area of the cross section; a moment of inertial of the cross section; a product of inertia of area of the cross section; angles of principal axes of the cross-section area; directions of principal axes of the cross-section area, etc.

Step S245 is furthermore implemented to also display on the screen values indicative of the calculated cross-section properties. These values are entered into the spreadsheet of Excel® in association of the identified beam element, whereby these values are stored therein for defining the aforementioned generalized-model.

Following that, step S246 indicated in FIG. 24 is implemented, if the user identifies at least one beam element which are interconnected and which is included by the currently identified beam-element, to display on the screen the identified at least one beam element in a three dimensional manner.

Figure 26:
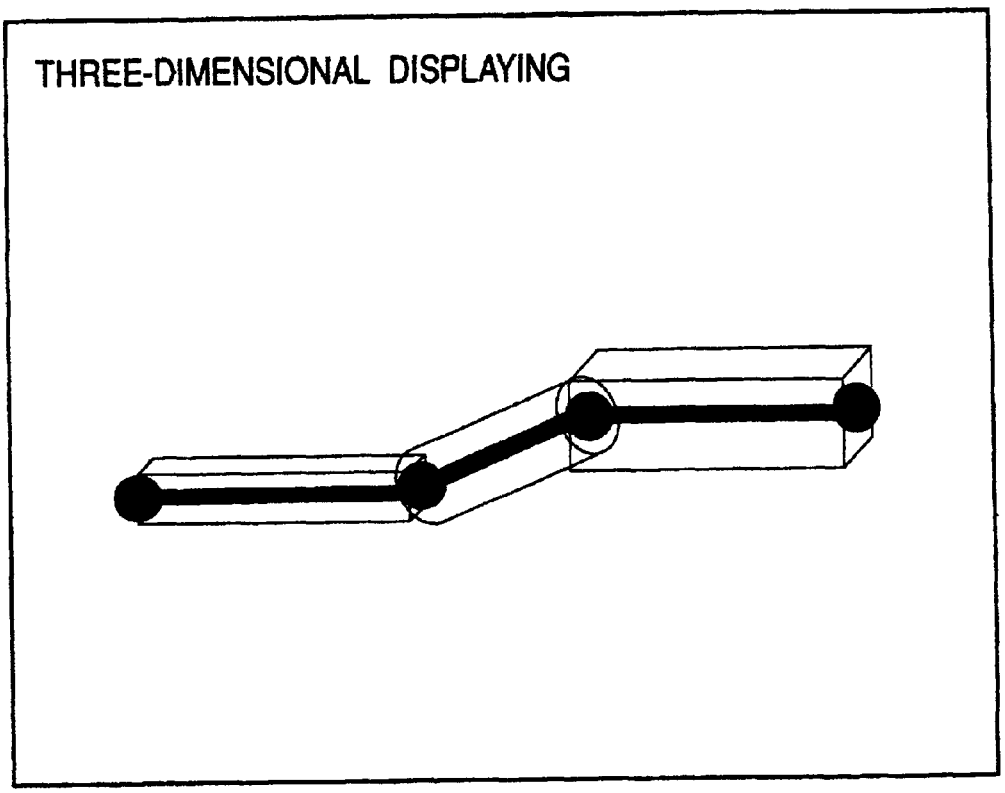
FIG. 26 is a front view showing one example of a 3-dimensional displaying referred to in step S246 indicated in FIG. 24.

In FIG. 26, there is illustrated one example of the three dimensional displaying. In this example, three beam elements connected in series are displayed in a three dimensional manner.

Afterward, step S247 indicated in FIG. 24 is implemented, if the user generates using the input device 14 a command for request for setting material properties, to automatically display a material-properties setting window on the screen, in response to the user's generating the command. This material-properties setting window constitutes one example of the "second support indication" set forth in the mode (18). The generation of the command may be achieved, as shown in FIG. 25, by an action that the user clicks the mouse 30 at a material-properties setting button displayed within the aforementioned cross-section-design window, for example.

Figure 27:
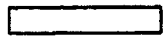
FIG. 27 is a front view showing one example of a material-properties setting window referred to in step S247 indicated in FIG. 24.

In FIG. 27, there is illustrated one example of the displayed material-properties setting window. In this example, the user is permitted to select one of iron, aluminum, or other material, as material of the identified beam element. In this example indicated in FIG. 27, iron has been selected as material of the indicated beam element.

Following that, step S248 indicated in FIG. 24 is implemented wherein the user inputs material of the currently indicated beam-element as its attribute, on the displayed material-properties setting window.

Subsequently, step S249 is implemented to enter data indicative of the inputted attribute into the spreadsheet of Excel® s in association with the identified beam element, whereby the data is stored therein.

One example of the content of the spreadsheet is illustrated in FIG. 28. In the spreadsheet, coordinate values indicative of locations (i.e., locations of a plurality of nodes belonging to the currently identified beam element), and attributes of the identified beam element are stored in association with the identified beam element, and it follows that the aforementioned generalized-model is defined by the stored data in the spreadsheet.

The attributes include, as shown in FIG. 28, a Young's modulus E, a Poisson's ratio v, and a specific gravity p, wherein these material constants are determined depending on the inputted material for the identified beam element.

Then, one cycle of execution of this beam-element-related-information input support routine is terminated.

There was described above this embodiment in the case where the user selects one beam element as the currently aimed element, and alternatively, there will be described below this embodiment in the case where the user selects one panel element as the currently aimed element.

In this case, step S204 indicated in FIG. 20 is implemented wherein the user inputs panel-element-related-information with the support of the computer unit 12.

Figure 29:
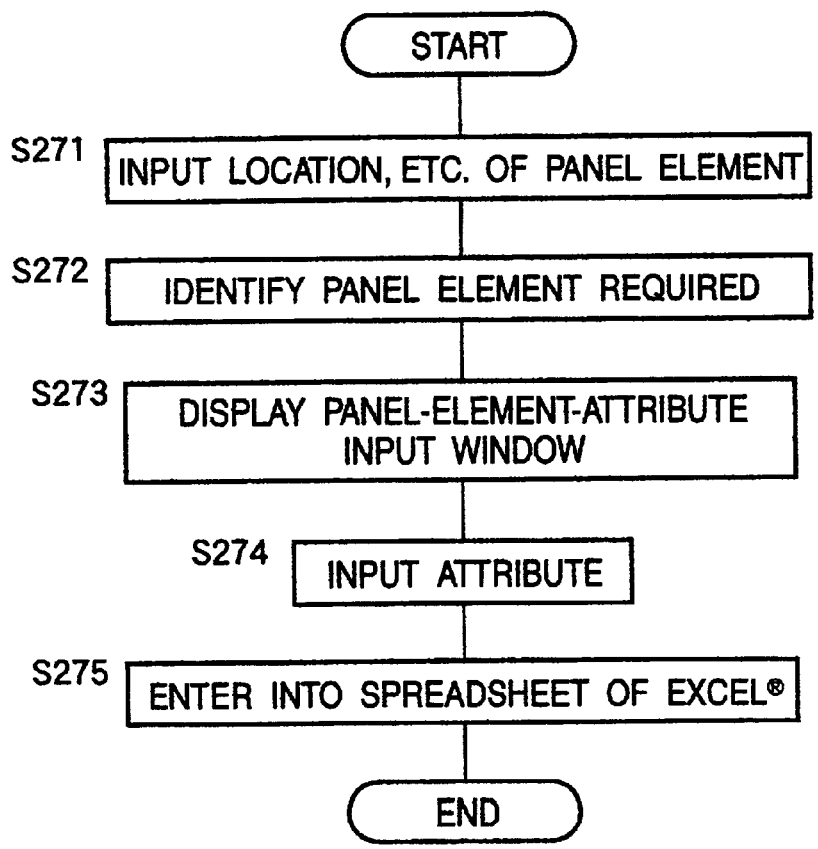
FIG. 29 is a flow chart for schematically illustrating the details of step 204 indicated in FIG. 20 under the title of panel-element-related-information input support routine.

In FIG. 29, there are schematically illustrated by a flow chart the details of step S204 under the title of panel-element-related-information input support routine.

This panel-element-related-information input support routine is initiated with step S271 wherein, like in step S221 indicated in FIG. 21, a location, a shape, and a thickness, of a beam element to be set is inputted, depending on the user's operations via the input device 14.

Figure 30:
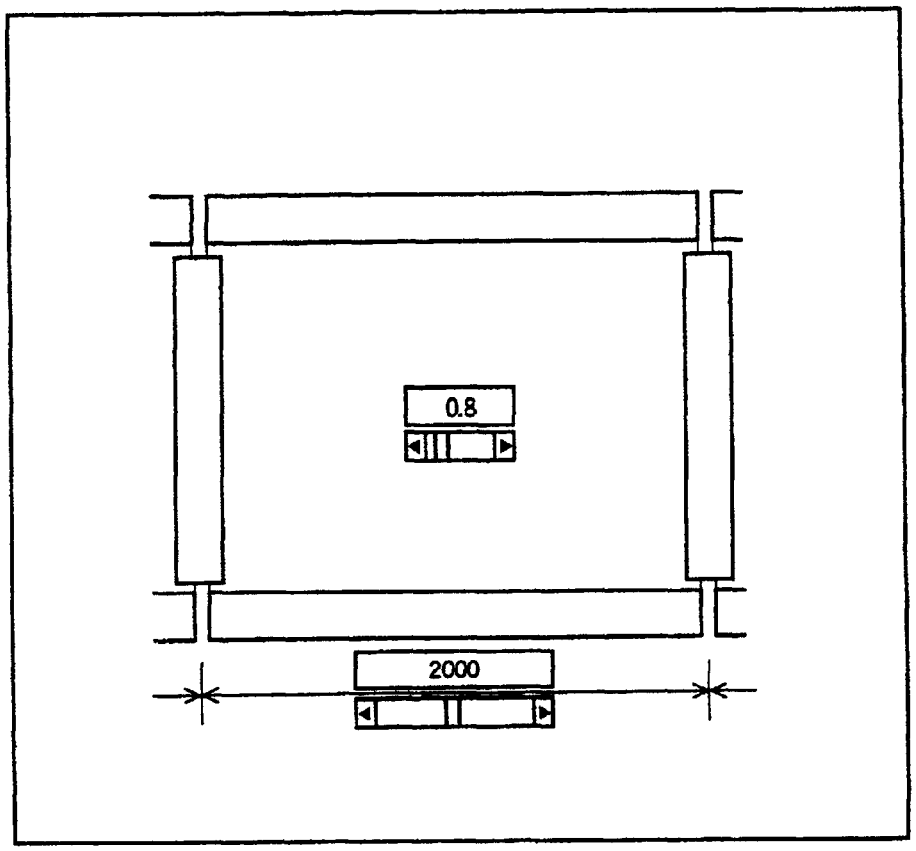
FIG. 30 is a front view for explaining how step S271 indicated in FIG. 29 is executed.

Referring next to FIG. 30, there is illustrated one example of an indication for supporting the user in inputting dimensions in a shape, and a thickness, of a panel element, in the case of the panel element being formed as a single rectangle.

In this example, the panel element is displayed in the form of a single planar figure, and those dimensions in the shape, and the thickness, of the panel element are inputted in the form of respective values variable depending on a distance by which a button disposed within a slide-type input bar on the screen is slid by the user's operation of the mouse 30. This means that the user is capable of graphically or visually inputting each dimension required to be inputted.

That is, in this embodiment, a single planar figure serves as a panel-element figure graphically representative of the presence of one panel element at a displaying location of the panel-element figure.

It is added that step S271 may be repeatedly executed for a plurality of panel elements to be set.

Step S272 is subsequently implemented wherein the user identifies any one of at least one panel element which has been thus set in location. The identification may be performed by an action that the user clicks the mouse 30 at any panel-element figure on the screen, for example.

Following that, step S273 is implemented to automatically display on the screen a panel-element-attribute input window, in response to the identification of the panel element. This panel-element-attribute input window is one example of the "second support indication" set forth in the mode (18), for example.

Figure 31:
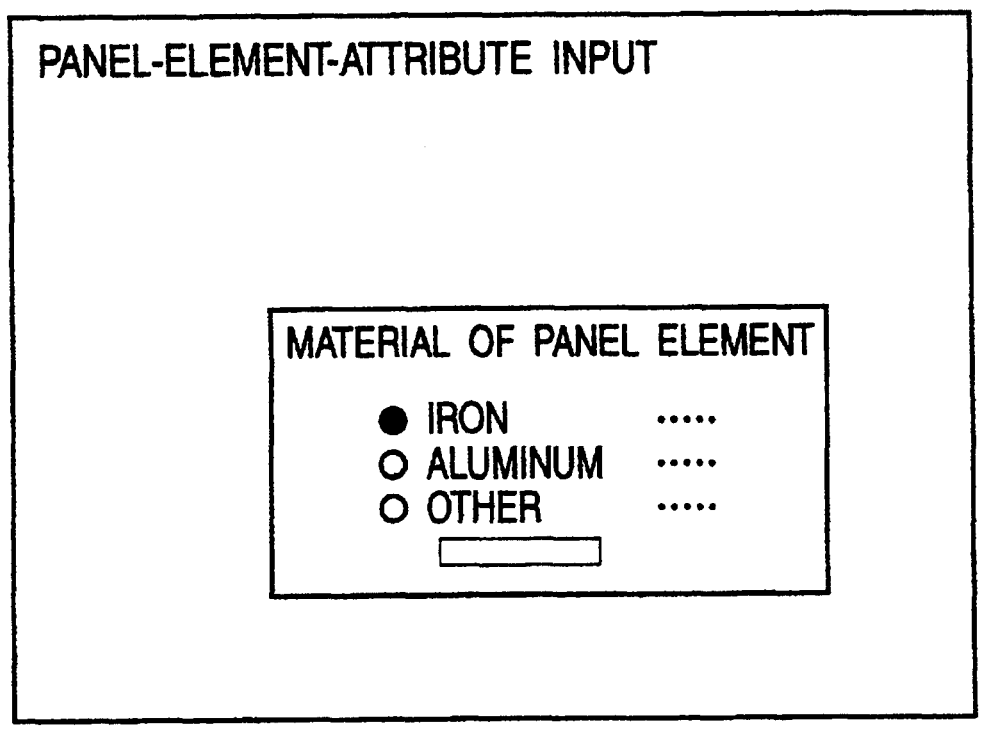
FIG. 31 is a front view showing one example of a panel-attribute input window referred to in step S273 indicated in FIG. 29.

One example of the panel-element-attribute input window is illustrated in FIG. 31. In this example, the user is permitted to select one of iron, aluminum, or other material, as material of the identified panel element. In this example indicated in FIG. 31, iron has been selected as material of the indicated panel element.

Following that, step S274 indicated in FIG. 29 is implemented wherein the user inputs material of the currently indicated panel-element as its attribute, on the displayed panel-element-attribute input window.

Subsequently, step S275 is implemented to enter data indicative of the inputted attribute into the spreadsheet of Excel® in association with the identified panel element, whereby the data is stored therein.

One example of the content of the spreadsheet is illustrated in FIG. 32. In the spreadsheet, coordinate values indicative of locations (i.e., locations of a plurality of nodes belonging to the currently identified panel element), and attributes of the identified panel element are stored in association with the identified panel element, and it follows that the aforementioned generalized-model is defined by the stored data in the spreadsheet.

The attributes include, as shown in FIG. 32, a Young's modulus E, a Poisson's ratio v, and a specific gravity p, wherein these Young's modulus E and Poisson's ratio v are determined depending on the inputted material for the identified panel element.

Then, one cycle of execution of this panel-element-related-information input support routine is terminated.

There was described above this embodiment in the case where the user selects one panel element as the currently aimed element, and alternatively, there will be described below this embodiment in the case where the user selects one design domain as the currently aimed element.

In this case, step S205 indicated in FIG. 20 is implemented wherein the user inputs design-domain-related-information with the support of the computer unit 12.

Figure 33:
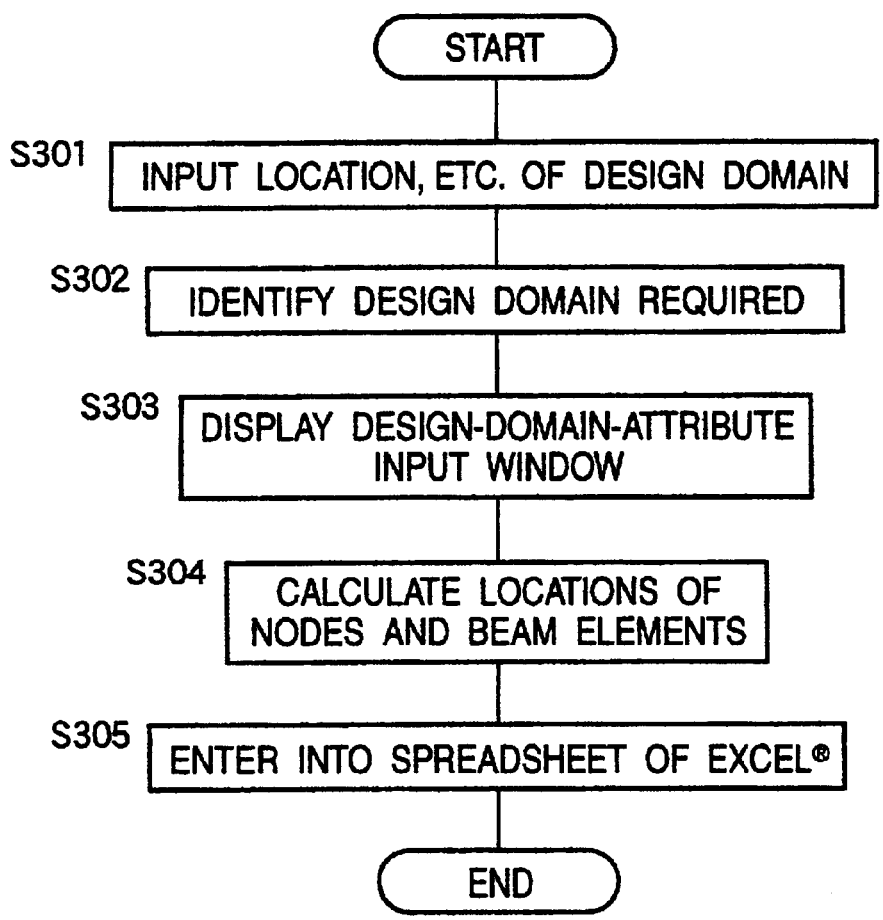
FIG. 33 is a flow chart for schematically illustrating the details of step 205 indicated in FIG. 20 under the title of design-domain-related-information input support routine.

In FIG. 33, there are schematically illustrated by a flow chart the details of step S205 under the title of design-domain-related-information input support routine.

This design-domain-related-information input support routine is initiated with step S301 wherein, like in step S221 indicated in FIG. 21, a location, and a shape, of a design domain to be set is inputted, depending on the user's operations via the input device 14.

Figure 34:
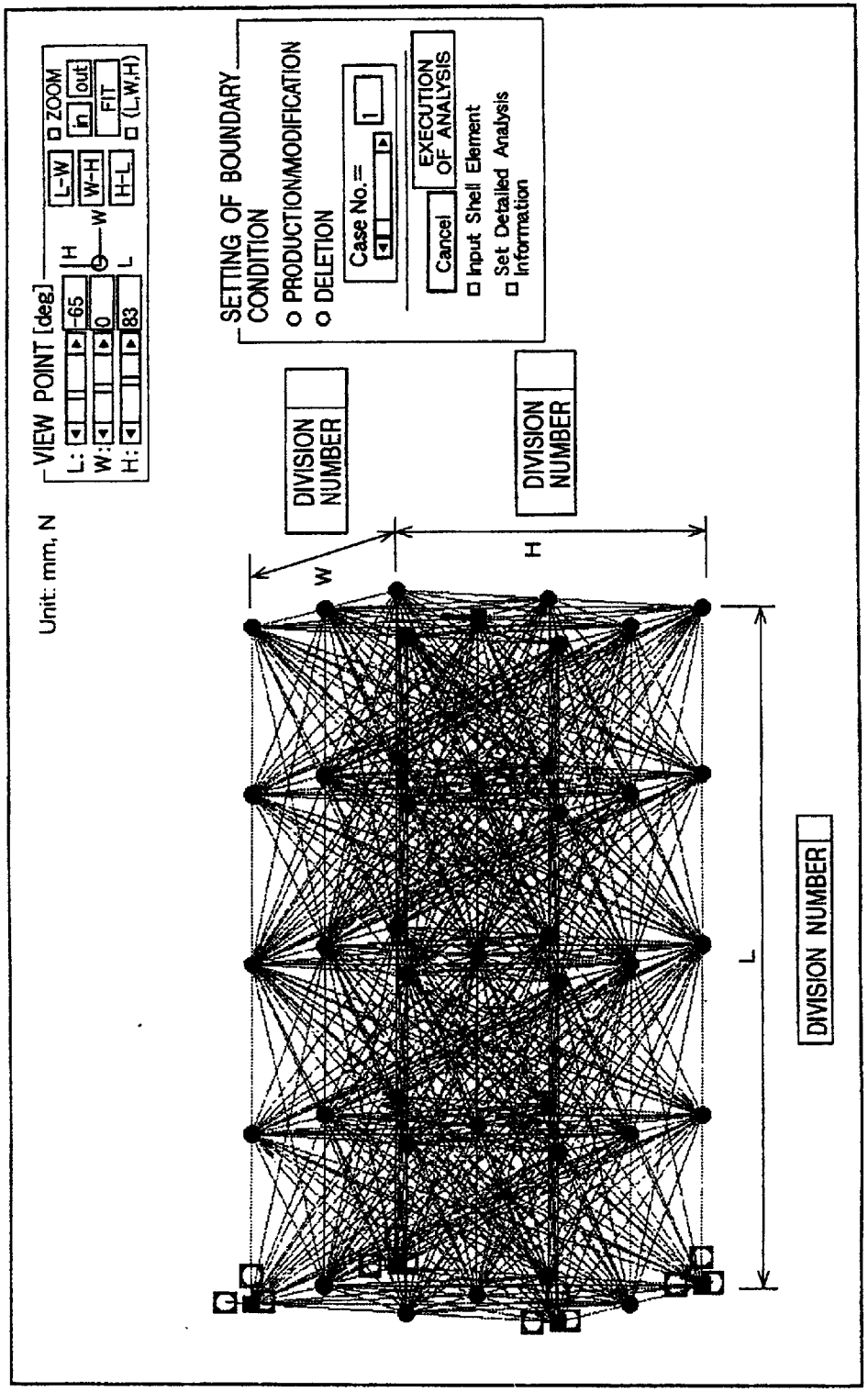
FIG. 34 is a front view showing one example of a design-domain-attribute input window referred to in step S303 indicated in FIG. 33.

Referring next to FIG. 34, there is illustrated one example of a three-dimensional displaying of the design domain on the screen, in the case where the design domain is formed as a single cuboid. In the FIG. 34, there is also illustrated procedures to set subsequently a plurality of nodes, a plurality of beam elements passing through the plurality of nodes, for the design domain. Wherein, the plurality of beam elements mean all the beam elements which can ideally exist under those nodes.

That is, in this embodiment, a single cuboid serves as a design-domain figure graphically representative of the presence of one design-domain at a displaying location of the design-domain figure.

It is added that the aforementioned topology optimization would remove ones of those beam elements unnecessary to meet a given requirement, with the result that only necessary beam elements would be selected as ones constituting an optimal structure of the design domain. One example of the above topology optimization is described in the specification of Japanese Patent Application No. 11-310338, which corresponds to U.S. patent application Ser. No. 09/696,961.

It is further added that, in this embodiment, after the generalized model has been specialized for the currently aimed design-domain, the topology optimization is carried out such that computer unit 12 executes an optimal-structure design program which has been stored in the storage medium 26 of the memory 22, to a specialized model which has been obtained by thus specializing the generalized model.

It is added that step S301 indicated in FIG. 33 may be repeatedly executed for a plurality of design domains to be set.

Step S302 is subsequently implemented wherein the user identifies any one of at least one design domains which has been thus set in location. The identification may be performed by an action that the user clicks the mouse 30 at any design-domain figure on the screen, for example.

Following that, step S303 is implemented to automatically display on the screen a design-domain-attribute input window, in response to the above identification of the design domain. This design-domain-attribute input is one example of the "second support indication" set forth in the mode (18), for example.

One example of the design-domain-attribute input window is illustrated in FIG. 34. In this example, the user is permitted to input a desired number of nodes which the user desires to provide on each one of a plurality of edges defining a configuration of the design domain. The plurality of edges consist of: edges L extending in a length direction of the design domain; edges H extending in a height direction of the design domain; and edges W extending in a width direction of the design domain. The number of nodes on each edge corresponds to a division number, which is to say, the number of sub-edges obtained by equally dividing each edge by a plurality of nodes. Setting the division number for each edge would lead to identification of locations and numbers of beam elements which can ideally exist within the currently aimed design domain.

That is, in this embodiment, the division number for each edge of the design domain constitutes one example of an attribute of the design domain.

Step S303 indicated in FIG. 33 is further implemented to display on the screen an indication for supporting the user in inputting a boundary condition required for the numerical analysis for the identified design domain. One example of the above indication is illustrated in FIG. 34 in the form of a block titled "Setting of Boundary Condition."

It will be understood that, in this embodiment, the boundary condition for the design domain also constitutes one example of the attribute of the design domain, and the above-mentioned indication for assisting the user in entering the boundary condition constitutes one example of the "third support indication" set forth in the mode (23).

Afterward, step S304 indicated in FIG. 33 is implemented to calculate, in order to dispose a plurality of beam elements within the identified design-domain, coordinate values indicative of locations of a plurality of nodes, and coordinate values indicative of locations of a plurality of beam elements, both positioned in the identified design-domain, on the basis of the inputted location and shape of the identified design-domain, and the inputted division number.

Following that, step S305 is implemented to store data indicative of the thus calculated coordinate values of locations, into the spreadsheet of Excel® g in association with the identified design-domain, whereby the data is stored therein.

Then, one cycle of execution of this design-domain-related-information input support routine is terminated.

If the execution of steps S202 to S205 indicated in FIG. 20, which was described above, once completes the construction of a generalized model, step S206 is followed to be implemented to make a determination as to whether the user desires to produce the following generalized-model. If the user desires, the determination becomes affirmative, resulting in this program returning to step S201. Instead, if the user does not desire, the determination becomes negative, resulting in this generalized-model-construction support program proceeding to step S207.

Step S207 is implemented to determine whether the user desires to integrate a plurality of generalized-models which the user has produced so far. If the user does not desire, the determination becomes negative. In this case, after step S208 is skipped, one cycle of execution of this generalized-model-construction support program is terminated. In contrast, if the user desires to integrate the plurality of generalized-models, the determination of step S207 becomes affirmative, leading to execution of step S208.

Figure 35:
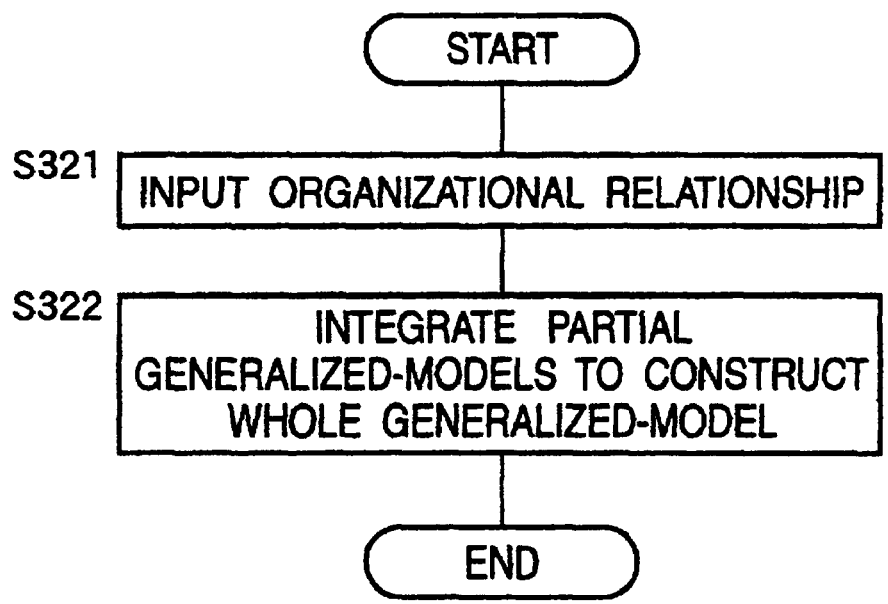
FIG. 35 is a flow chart for schematically illustrating the details of step 208 indicated in FIG. 20 under the title of model integration routine.

In FIG. 35, there are schematically illustrated by a flow chart the details of step S208 under the title of model integration routine.

This model integration routine is initiated with step S321 wherein the user inputs an organizational relationship between a plurality of parts of the automotive body which are represented by the plurality of generalized-models produced by the user so far.

Figure 36:
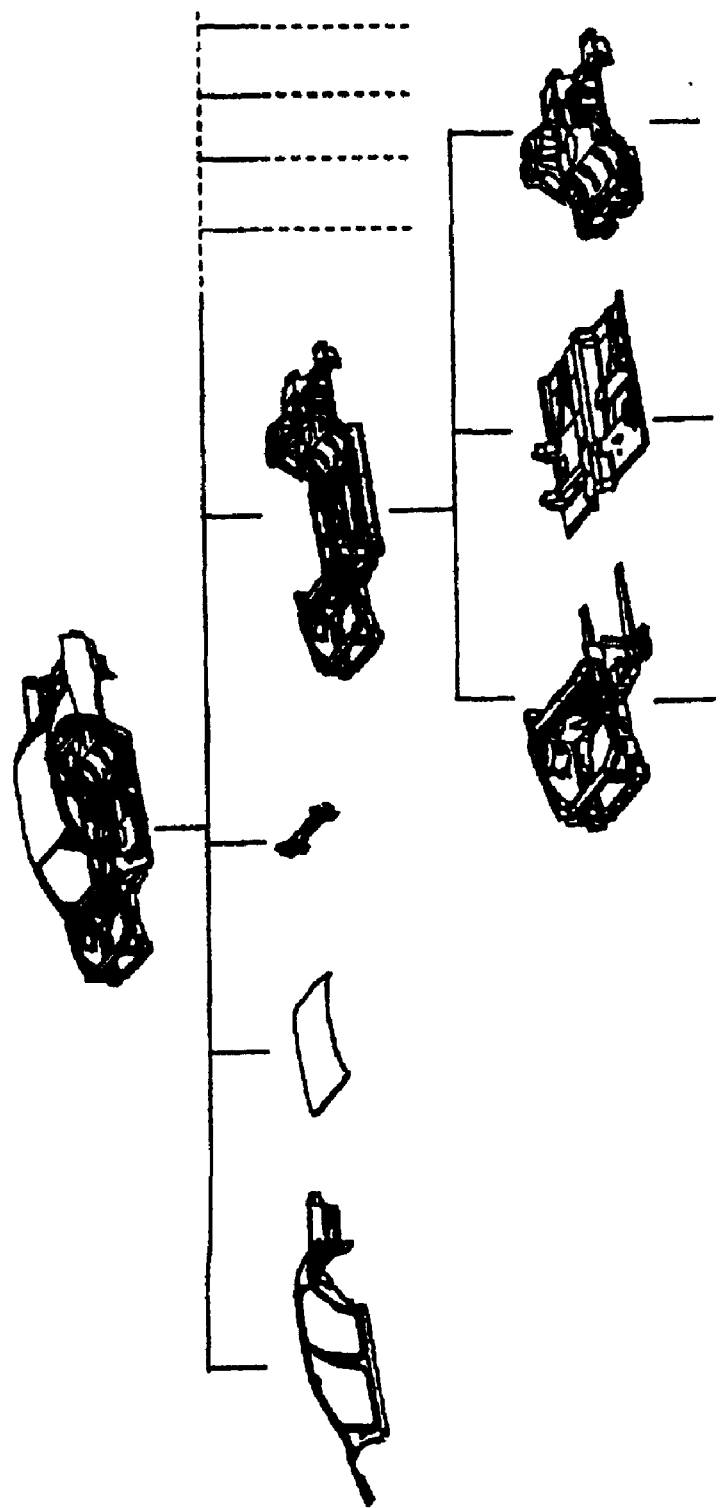
FIG. 36 is a front view for explaining how step S321 indicated in FIG. 35 is executed.

Referring next to FIG. 36, there is illustrated, by way of example, an automotive body constructing by of a plurality of parts thereof. In FIG. 36, there is also illustrated by a tree diagram the plurality of parts which are associated with each other in a hierarchal structure.

In this example, the automotive body constitutes one example of the "whole object" set forth in the mode (24), each part constitutes one example of the "partial object" set forth in the same mode, the generalized model representative of the body constitutes one example of the "whole generalized-model" set forth in the same mode, and the generalized model representative of each part of the body constitutes one example of the "partial generalized-model" set forth in the same mode.

It will be clean from the above example that, in step S321 indicated in FIG. 35, a plurality of generalized models produced so far are treated as a plurality of partial generalized-models, and an organizational relationship between these partial generalized-models is inputted by the user in a hierarchal structure.

Following that, step S322 is implemented to integrate those partial generalized-models according to the inputted organizational-relationship, thereby producing a unitary whole generalized-model.

Then, one cycle of execution of this model integration routine is terminated, and accordingly, one cycle of execution of the generalized-model-construction support program is also terminated.

Figure 37:
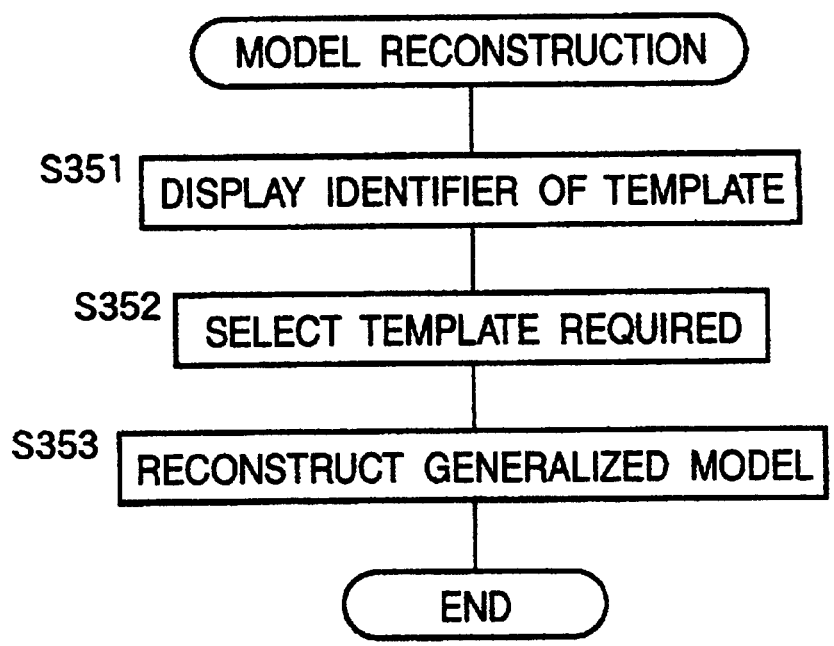
FIG. 37 is a flow chart for schematically illustrating a model reconstruction program indicated in FIG. 20.
Figure 38:
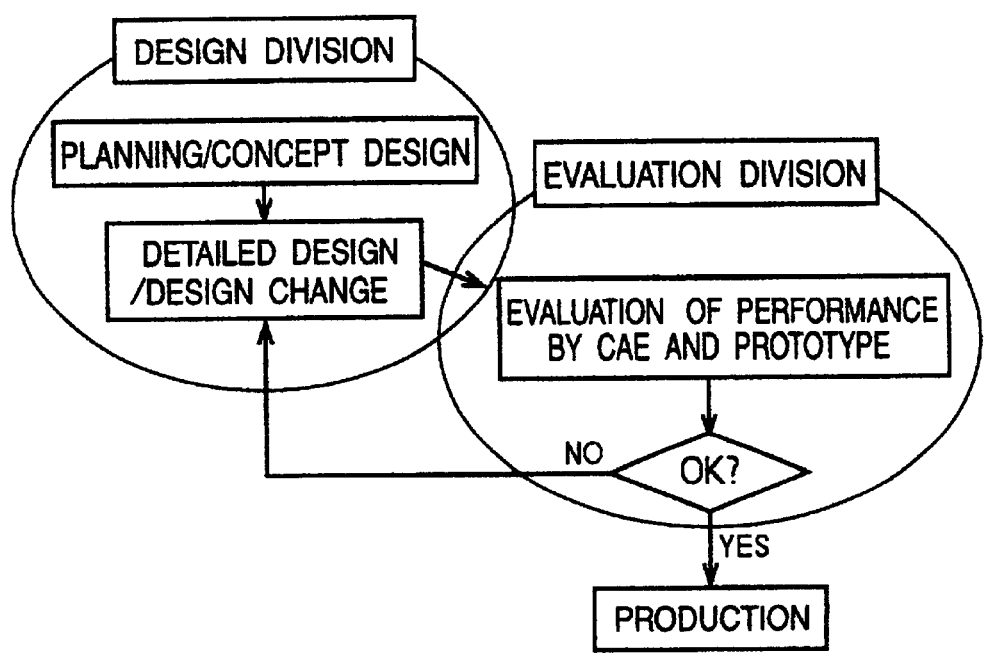
FIG. 38 is a flow chart for explaining an ordinary flow of automotive development.

Referring next to FIG. 37, there is schematically illustrated the aforementioned model reconstruction program.

Prior to the description of the model reconstruction program, it is noted that the performance-analysis support system constructed according to this embodiment is configured such that, during the process in which each generalized model is produced by the execution of the generalized-model-construction support program, the user's operations via the input device 14 for the construction of the each generalized model are sequentially stored in the memory 22 in association with an identifier of the individual generalized-model, as a template. By making the use of this configuration as the premise, the above-mentioned model reconstruction program is formulated.

This model reconstruction program is initiated with step S351 to read out from the memory 22, each identifier of at least one template which has been stored therein, resulting in the each identifier being displayed on the screen.

Step S351 is followed by step S352 wherein the user selects any one of the displayed at least one identifier, and eventually a current template is selected.

Subsequently, step S353 is implemented to read out from the memory 22, data indicative of the selected current template, followed by the fact that the generalized-model-construction support program is executed on the basis of the data. This permits the user to reproduce the same generalized-model as the previous one, without repeating the same operations as the previous ones.

Then, one cycle of execution of this model reconstruction program is terminated.

It will be understood from the above description that, in this embodiment, a generalized model is constructed by at least one of a node, a beam element, a panel element, and a design domain, wherein each one of these beam element, panel element, and design domain constitutes one example of the "discrete element" set forth in the mode (2).

In addition, in this embodiment, the generalized-model-construction support program constitutes one example of the "construction support step" set forth in the mode (17), the node-related-information input routine constitutes one example of the "node definition support step" set forth in the mode (18), and each one of the beam-element-related-information input routine, the panel-element-related-information input routine, and the design-domain-related-information input routine constitutes one example of the "discrete element definition support step" set forth in the mode (18).

Furthermore, in this embodiment, the beam-element-related-information input routine constitutes one example of the "beam-element definition support step" set forth in the mode (19), and each one of steps S243 and S246 of the routine constitutes one example of the "cross-section shape displaying step" set forth in the mode (20).

Still further, in this embodiment, the panel-element-related-information input routine constitutes one example of the "panel-element-related-information definition support step" set forth in the mode (21), and the design-domain-related-information input routine constitutes one example of the "design-domain definition support step" set forth in the mode (22).

Moreover, in this embodiment, each of a portion of step S223 of the node-related-information input routine which relates to an input support for the boundary condition (including the fixing condition about a degree of freedom in motion, and the loading condition), and a portion of step S303 of the design-domain-related-information input routine which relates to an input support for the boundary condition constitutes one example of the "boundary-condition setting support step" set forth in the mode (23).

In addition, in this embodiment, the model integration routine constitutes one example of the "whole generalized-model construction step" set forth in the mode (24).

Further, in this embodiment, the model reconstruction program constitutes one example of the "reproducing step" set forth in the mode (25).

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A method of supporting a user in mechanically analyzing a performance of an object, using an input device, a display device having a screen for display, and a computer connected to the input device and the display device, the method comprising:

graphically displaying on the screen a generalized model which is constructed as a numerical analysis model for the object such that the generalized model has been generalized with respect to at least configuration of a configuration, a structure, and a mechanism, of the object, and has been specialized with respect to a function of the object;

data-entry displaying on the screen an item for letting the user enter data using the input device in order to define a specialized model which is constructed as a numerical analysis model for the object by specializing the displayed generalized model with respect to the at least configuration thereof, and mechanically analyzing the performance of the object, on the basis of the specialized model defined by the data entered by the user in association with the displayed item, a numerical analysis approach predetermined in accordance with the function of the object, and a numerical analysis condition determined by the user or predetermined as a standard condition, wherein the object is a subject one of a plurality of components of a single product, which subject component has been selected by the user, wherein the generalized model is a subject generalized-model corresponding to the subject component, wherein the subject genrealized-model is one of a plurality of numberical analysis models respectively for the plurality of components, wherein each numberical analysis model has been generalized with respect to at least one of a configuration, a structure, and a mechanism, of each component of the object, wherein each numberical analysis model has been specialized with respect to a function of each component of the object, wherein the graphically displaying comprises displaying the plurality of components distinguishably from each other on the screen, displaying an indication on the screen for letting the user select as the subject component one of the plurality of components, and graphically displaying on the screen one of the plurality of generalized models which corresponds to the subject component which has been selected by the user in response to the indication, and wherein the mechanically analyzing comprises mechanically analyzing a performance of the subject component, on the basis of the specialized model defined by data which have been entered by the user in association with the displayed item on the screen, the numerical analysis approach predetermined in accordance with the function of the subject component, and the numerical analysis condition.

2. The method according to claim 1, wherein each numerical analysis model has a plurality of features representing geometrical properties of the object in the form of a node having an attribute thereof and a discrete element having an attribute thereof.

3. The method according to claim 1, wherein the mechanically analyzing comprises mechanically analyzing the performance of teh object by directly using the specialized model.

4. The method according to claim 1, wherein the item is configured to let the user enter using the input device, data for specializing the generalized model with respect to at least configuration, a structure, and a mechanism, of the generalized model.

5. The method according to claim 1, wherein the data-entry displaying comprises figure displaying on the screen, in association with the displayed generalized model, a figure for supporting the user in graphically entering data for the item.

6. The method according to claim 5, wherein:
the item is configured to let the user enter numberical data; and
the figure displaying comprises numberical-data-entry displaying on the screen a figure which support the user in graphically entering the numerical data in association with the item.

7. The method according to claim 6, wherein:
the input device comprises a pointing device thereof; and
the numerical-data-entry displaying comprises displayed at least one of a bar, a pointer, or a cursor which is moved on the screen depending on an amount by which the user operates the pointing device of the input device, and which lets numerical data enter into the computer depending on an amount by which the bar, the pointer, or the cursor has been moved, with respect to the item, to thereby support the user in entering the numerical data into the computer.

8. The method according to claim 6, wherein:
the input device comprises a keyboard thereof; and
the data-entry displaying further includes,
keyboard-indicator displaying on the screen of an indication letting the user directly enter the numerical data by operating the keyboard of the input device, and
selectively effecting the figure displaying and the keyboard-indicator displaying.

9. The method according to claim 1, wherein the mechanically analyzing comprises resulatant-analysis displaying on the screen in association with the object, analysis results obtained from the numerical analysis model.

10. The method according to claim 9, wherein:
the analysis results comprise mechanical characteristic values for a segment of the object; and
the resultant-analysis displaying comprises graphically displaying on the screen each one of the mechanical characteristic values, in the form of a figure which is changed in at least one of a size, a configuration, a pattern, and a color, of the figure, depending on a magnitude of the each one of the mechanical characteristic values.

11. The method according to claim 9, wherein the mechanically analyzing further comprises:
numerically displaying the analysis results on the screen; and
selectively effecting the resultant-analysis displaying and the numerically displaying.

12. The method according to claim 1, wherein each of a plurality of sets of data representative of the generalized model, the specialized model, the numerical analysis approach, and the numerical analysis condition, repectively, has been constructed in an executable format in which each set of data can be executed by an operating system installed in the computer, without causing the computer to execute a special application program.

13. A computer program to be executed by a computer to implement the method according to claim 1.

14. A computer-readable storage medium having stored therein the computer program according to claim 13.

15. A method of supporting a user in mechanically analyzing a performance of an object, using an input device, a display device having a screen for display, and a computer connected to the input and the display device, the method comprising:
providing construction support implemented before a specialized model has been defined by the user's converting a generalized model into the specialized model,
wherein the generalized model serves as a numerical analysis model for the object, has been generalized with respect to at least configuration of a configuration, a structure, and a mechanism, of the object,
wherein the generalized model has been specialized with respect to a function of the object,
wherein the generalized model has a plurality of features representing geometrical properties of teh object in the form of a node having an attribute thereof and a discrete element having an attribute thereof, the specialized model is obtained by specializing the generalized model with respect to the at least configuration,
wherein the providing construction support is implemented to display on the screen an indication which supports the user in constructing the generalized model by the user's defining the node and the discrete element using the input device, and includes, defining a node location to be established, in response to an action that the user identifies, on the screen using the input device, displaying a node figure representative of being the node, at the identified location; and, in response to an action that the user indicates the displayed node figure, displaying a first support indication which supports the user in setting the attribute of the node which has been represented by the displayed node figure, and defining a discrete element definition including a location at which the discrete element is to be established, in response to an action that the user identifies on the screen using the input device, displaying a discrete element figure representative of being the discrete element, at the identified location, and, in response to an action that the user indicates the displayed discrete element figure, displaying a second support indication which supports the user in setting the attribute of the discrete element which has been represented by the displayed discrete element figure.

16. The method according to claim 15, wherein:

the discrete element comprises a beam element having an attribute thereof;

the attribute of the beam element comprises at least one of a cross-section shape of a real member represented by the beam element, a thickness of the real member, and a material property of the real member; and the defining a discrete element definition comprises defining a beam-element definition including a location at which the beam element is to be established, in response to an action that the user identifies on the screen using the input device, displaying a beam-element figure representative of being the beam element, at the identified location; and, in response to an action that the user indicates the displayed beam-element figure, displaying as the second support indication, an indication which supports the user in setting the attribute of the beam element which has been represented by the displayed beam-element figure.

17. The method according to claim 16, wherein:

the attribute of the beam element comprises a cross-section shape of the real member represented by the beam element; and the method further comprises displaying a cross-section shape, once the user sets the cross-section shape depending on the second support indication, that graphically displays the set cross-section shape on the screen.

18. A method according to claim 15, wherein:

the discrete element comprises a panel element having an attribute thereof;

the attribute of the panel element comprises at least one of a thickness of a real member represented by the panel element, and a material property of the real member; and the defining a discrete element definition comprises defining a panel-element definition including a location at which the panel element is to be established in response to an action that the user identifies on the screen using the input device, displaying a panel- element figure representative of being the panel element at the identified location, and, in response to an action that the user indicates the displayed panel-element figure, displaying as the second support indication, an indication which supports the user in setting the attribute of the panel element which has been represented by the displayed panel-element figure.

19. The method according to claim 15, wherein:

the discrete element comprises a design domain, a structure of which is intended to be designed by a topology optimization for achieving a required function, the design domain has an attribute thereof;

the attribute of the design domain comprises a condition on the structure to be adapted to the design domain; and the defining a discrete element definition comprises defining a design-domain definition including a location at which the design domain is to be established, in respone to an action that the user identifies on the screen using the input device, displaying a design-domain figure representative of being the design domain at the identified location, and, in response to an action that the user indicates the displayed design-domain figure, displaying as the second support indication an indication which supports the user in setting the attribute of the design domain which has been represented by the displayed design-domain figure.

20. The method according to claim 15, wherein:

the object is a product constructed by a combination of a plurality of parts;

an organizational relationship according to which the plurality of parts are associated with each other is hierarchal; and the method further includes, constructing a whole generalized-model construction, when the user sets the organizational relationship using the input device, in response to an event that the generalized model has been constructed for each of the plurality of parts as a partial generalized-model; and integrating a plurality of partial generalized-models respectively constructed for the plurality of parts, according to the set organizational relationship, to thereby automatically construct a whole generalized-model representative of the whole of the product.

21. The method according to claim 15, further comprising:

storing into a memory of the computer, as a template, procedures in which the generalized model has been constructed by the user using the input device; and in response to a specific command from the user, reading out the template from the memory for thereby automatically reconstructing the same generalized model.

22. The method according to claim 15, wherein each of a plurality of sets of data representative of the generalized model, the specialized model, the numerical analysis approach, and the numerical analysis condition, respectively, has been constructed in an executable format in which the each set of data can be executed by an operating system installed in the computer, without causing the computer to execute special application program.

23. A computer program to be executed by a computer to implement the method according to claim 15.

24. A computer-readable storage medium having stored therein the computer program according to claim 23.

* * * * *